United States Patent
Tsuchiya

(10) Patent No.: US 8,395,235 B2
(45) Date of Patent: Mar. 12, 2013

(54) SEMICONDUCTOR DEVICE

(75) Inventor: Keiichi Tsuchiya, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 65 days.

(21) Appl. No.: 12/861,219

(22) Filed: Aug. 23, 2010

(65) Prior Publication Data

US 2011/0062552 A1 Mar. 17, 2011

(30) Foreign Application Priority Data

Sep. 11, 2009 (JP) ................... 2009-210472

(51) Int. Cl.
*H01L 29/92* (2006.01)
(52) U.S. Cl. ............. 257/532; 257/306; 257/E29.342; 257/E27.084
(58) Field of Classification Search ............ 257/532, 257/E29.342, 306, E27.084
See application file for complete search history.

(56) References Cited

U.S. PATENT DOCUMENTS

2008/0111212 A1* 5/2008 Wu .................... 257/532
2008/0179652 A1* 7/2008 Sugioka .............. 257/306

FOREIGN PATENT DOCUMENTS

| JP | 09-191084 | 7/1997 |
| JP | 2002-313952 | 10/2002 |
| JP | 2004-072078 | 3/2004 |
| JP | 2004-311918 | 11/2004 |

* cited by examiner

*Primary Examiner* — Marc Armand
(74) *Attorney, Agent, or Firm* — Young & Thompson

(57) ABSTRACT

A semiconductor device may include, but is not limited to a first electrode upwardly extending, and a second electrode upwardly extending along the first electrode. The first electrode includes a lower portion and an upper portion. The second electrode covers a bottom surface and an outer side surface of the lower portion of the first electrode. The upper portion of the first electrode is positioned higher than the second electrode.

16 Claims, 18 Drawing Sheets

SEMICONDUCTOR DEVICE

BACKGROUND OF THE INVENTION

1. Field of the Invention

The present invention relates to a semiconductor device. Particularly, the present invention relates to a semiconductor device including a capacitor as a memory element.

Priority is claimed on Japanese Patent Application No. 2009-210472, filed Sep. 11, 2009, the content of which is incorporated herein by reference.

2. Description of the Related Art

Recently, the area of each element forming a semiconductor device has been reduced with the miniaturization of semiconductor devices. Regarding DRAM (Dynamic Random Access Memory) including a memory cell portion and a peripheral circuit portion, the area of the memory cell portion is being reduced. A crown-shaped capacitor has been proposed in order to achieve sufficient capacitance of a capacitor forming a memory cell portion.

Capacitor structures have been complicated in order to achieve higher capacitance. For example, Japanese Patent Laid-Open Publication No. 2004-311918 discloses a capacitor, which includes stacked lower electrodes that are a first lower electrode and a second lower electrode on the first lower electrode. The first lower electrode is cylindrical, and the second lower electrode is crown-shaped, thereby achieving sufficient capacitance and enabling a reduction in defects at the time of a dry etching process.

As a capacitor including stacked lower electrodes, Japanese Patent Laid-Open Publication No. 2004-72078 discloses a capacitor, which includes stacked lower electrodes that are a lower storage electrode and an upper storage electrode on the lower storage electrode. Japanese Patent Laid-Open Publication No. 2002-313952 discloses a capacitor having a stacked cylindrical structure, which is formed by repeating a process of forming a hole in an inter-layer insulating film and a process of forming an electrode covering an inner surface of the hole.

As a method of simultaneously etching a capacitor including stacked lower electrodes, Japanese Patent Laid-Open Publication No. H09-191084 discloses a method including a process of forming a first inter-layer insulating film and a second inter-layer insulating film on the first inter-layer insulating film, and a process of forming first and second holes penetrating the first and second inter-layer insulating films, respectively. The first and second diameters of the first and second holes are changed so that first and second etching rates of the first and second inter-layer insulating films are changed, thereby enabling formation of the capacitor including stacked lower electrodes in one process.

However, if the allowable area of a plan region in which a capacitor is formed is reduced with the miniaturization of semiconductor elements, even the capacitor structure disclosed in Japanese Patent Laid-Open Publication No. 2004-311918 cannot achieve a predetermined capacitance. Further, if the aspect ratio of the capacitor increases, regardless of whether the lower electrode is cylindrical or crown-shaped, mechanical strength of the lower electrode decreases, thereby causing the lower electrode to collapse. Moreover, the contact area between the first lower electrode and the second lower electrode on the first lower electrode decreases, thereby increasing contact resistance, and therefore causing a degradation of characteristics of the capacitor as a memory element.

SUMMARY

In one embodiment, a semiconductor device may include, but is not limited to a first electrode upwardly extending, and a second electrode upwardly extending along the first electrode. The first electrode includes a lower portion and an upper portion. The second electrode covers a bottom surface and an outer side surface of the lower portion of the first electrode. The upper portion of the first electrode is positioned higher than the second electrode.

In another embodiment, a semiconductor device may include, but is not limited to first and second electrodes upwardly extending from a semiconductor substrate. The first electrode includes first and second portions. The first portion includes a first upper portion and a first lower portion. The second portion covers the first lower portion of the first portion. The first upper portion of the first portion is positioned higher than the second portion. The second electrode is separated from the first electrode. The second electrode includes third and fourth portions. The third portion includes a second upper portion and a second lower portion. The fourth portion covers the second lower portion of the third portion. The second upper portion of the third portion is positioned higher than the fourth portion.

In still another embodiment, a semiconductor device may include, but is not limited to a plurality of electrodes and a first supporter. The plurality of electrodes upwardly extends from a semiconductor substrate. Each of the plurality of electrodes has an upper portion and a lower portion. The first supporter connects the upper portion of each of the plurality of electrodes. The first supporter horizontally extends. The first supporter overlaps a half of the upper portion of each of the plurality of electrodes in plan view.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The present invention will now be described herein with reference to illustrative embodiments. The accompanying drawings explain a semiconductor device and a method of manufacturing the semiconductor device in the embodiments. The size, the thickness, and the like of each illustrated portion might be different from those of each portion of an actual semiconductor device.

Those skilled in the art will recognize that many alternative embodiments can be accomplished using the teachings of the present invention and that the present invention is not limited to the embodiments illustrated herein for explanatory purposes.

Figure 1:
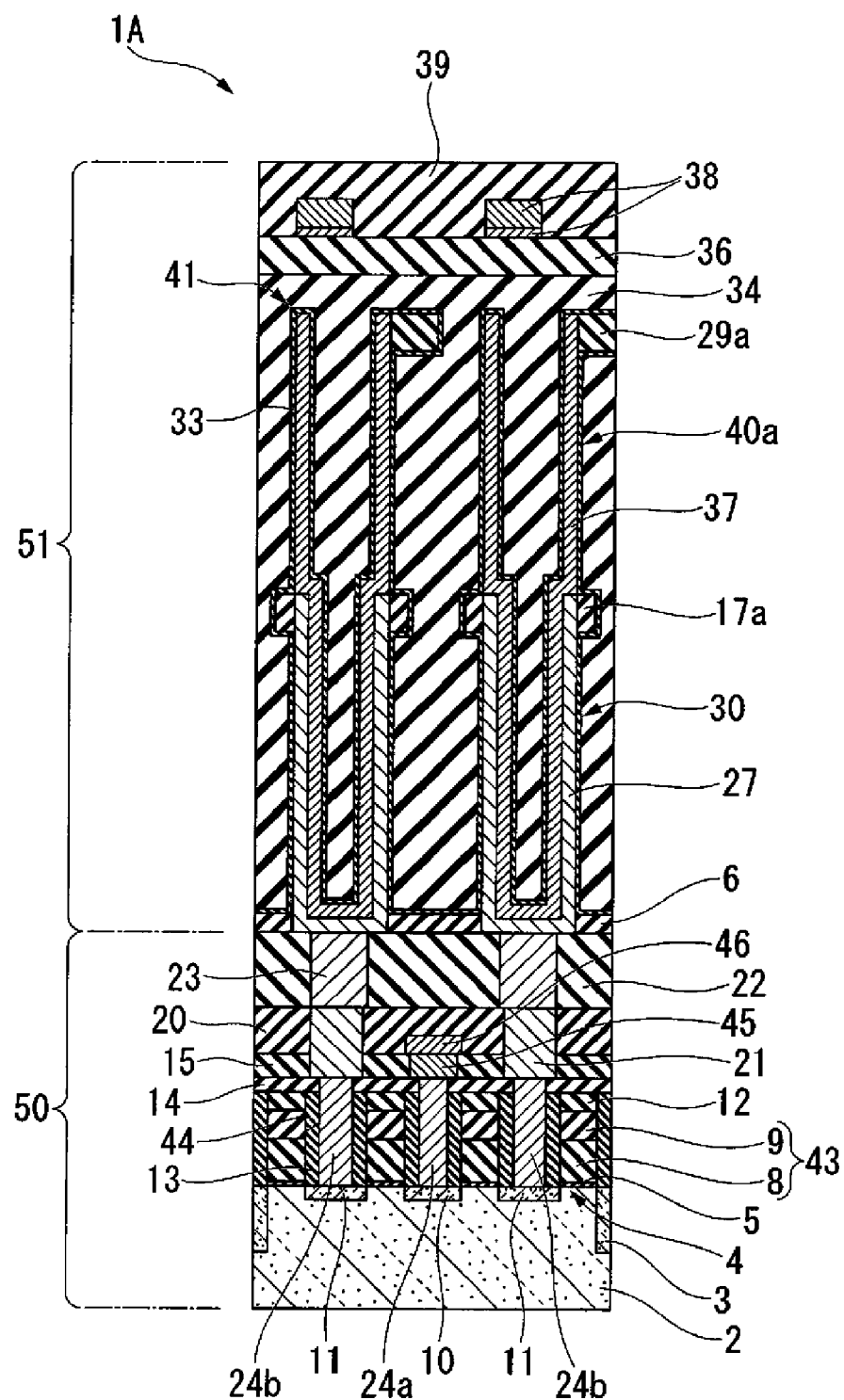
FIGS. 1 to 17 are cross-sectional views illustrating a method of manufacturing a semiconductor device according to a first embodiment of the present invention.

Hereinafter, a semiconductor device 1A according to a first embodiment of the present invention is explained with reference to accompanying drawings. FIG. 1 is a cross-sectional view illustrating the semiconductor device 1A.

The semiconductor device 1A includes, but is not limited to a transistor layer 50 and a capacitor layer 51. The transistor layer 50 includes, but is not limited to: a substrate (semiconductor substrate) 2; a gate electrode 43; a first cell contact plug 24a; a second cell contact plug 24b; a bit-line contact plug 45; a first capacitor contact plug 21; and a second capacitor contact plug 23.

The substrate (semiconductor substrate) 2 includes silicon (Si) containing a p-type impurity at a predetermined concentration. Element isolation regions 3 are formed by embedding a silicon oxide film ($SiO_2$) and the like in grooves in the semiconductor substrate 2. The element isolation regions 3 define an element formation region 4. First and second SD (source and/or drain) regions 10 and 11 are formed in the semiconductor substrate 2, adjacent to an upper surface of the semiconductor substrate 2. An n-type impurity, such as phosphorus (P), is diffused in the first and second SD regions 10 and 11. The first and second SD regions are separated from each other.

The gate electrode 43 includes a multi-layered film including a poly-crystalline silicon film 8 on the gate insulating film 5 and a metal film 9. The poly-crystalline silicon film 8 can be formed by introducing phosphorus (P) therein when the poly-crystalline silicon film 8 is formed using CVD (Chemical Vapor Deposition).

Alternatively, a poly-crystalline silicon film free of an impurity is formed first, and then an n-type or p-type impurity may be ion-implanted in a later process. The metal film 9 includes a high melting point metal, such as tungsten (W), nitride tungsten (WN), and tungsten silicide (WSi). A gate mask nitride film 12 is deposited on the metal film 9.

The first cell contact plug 24a is formed on the first SD region 10. The second cell contact plug 24b is formed on the second SD region 11. Thus, the first and second cell contact plugs 24a and 24b are connected to the first and second SD regions 10 and 11, respectively.

A gate sidewall nitride film 13, made of silicon nitride ($Si_3N_4$), is formed so as to cover each of side surfaces of the gate electrode 43, and the first and second cell contact plugs 24a and 24b. A first inter-layer insulating film 14 is formed over the gate electrode 43, and the first and second cell contact plugs 24a and 24b. A second inter-layer insulating film 15 is formed over the first inter-layer insulating film 14. A third inter-layer insulating film 20 is formed over the second inter-layer insulating film 15.

The bit-line contact plug 45 includes, for example, a barrier film (TiN/Ti) and a tungsten (W) film over the barrier film. The barrier film includes a multi-layered film including a titanium (Ti) film and a titanium nitride (TiN) film. The bit-line contact plug 45 penetrates the second inter-layer insulating film 15. Upper and lower surfaces of the bit-line contact plug 45 are in contact with a bit wire 46 and the first contact plug 24a, respectively.

The bit wire 46 includes a multi-layered film including a tungsten nitride (WN) film and a tungsten (W) film. The bit wire 46 is connected to the bit-line contact plug 45. Upper and side surfaces of the bit wire 46 are covered by the third inter-layer insulating film 20. A fourth inter-layer insulating film 22 is formed over the third inter-layer insulating film 20.

The first capacitor contact plug 21 penetrates the second and third inter-layer insulating films 15 and 20. The first capacitor contact plug 21 is connected to the second cell contact plug 24b. The second capacitor contact plug 23 penetrates the fourth inter-layer insulating films 22. The fourth capacitor contact plug 23 is connected to the first capacitor contact plug 21.

The capacitor layer 51 includes, but is not limited to: a stopper insulating film 6; a first lower electrode 30; a second lower electrode 40a; a capacitor insulating film 33; an upper electrode 34; a fifth inter-layer insulating film 36; a wire 38; and a sixth inter-layer insulating film 39.

The stopper insulating film 6 includes a nitride film having a thickness of, for example, 100 nm. The stopper insulating film 6 covers the fourth inter-layer insulating film 22.

The first lower electrode 30, which is hollow cylindrical, penetrates the stopper insulating film 6. The first lower electrode 30 includes a first electrode film 27 having a bottom surface connected to the second capacitor contact plug 23. The first lower electrode 30 has a crown shape. Upper and inner surfaces of the crown-shaped first lower electrode 30 are in contact with the second lower electrode 40a. An outer surface of the first lower electrode 30 is in contact with the capacitor insulating film 33.

A first supporter 17a is connected to an upper portion of an outer side surface of the first electrode film 27. The first supporter 17a has a first hole 28a, which is an elongated hole in plan view. The first supporter 17a has a net-like shape so that the first supporter 17a connects multiple upper portions of outer side surfaces of the first electrode films 27. Each of the first holes 28 is provided in a rhomboid region defined by four lines connecting four centers of four nearest neighbor first lower electrodes 30. The first hole 28a is separated from any of the first lower electrodes 30. Accordingly, the first supporter 17a connects all of the first lower electrodes 30.

The second lower electrode 40a, which is cylindrical and forms an upper capacitor, includes a second electrode film 37a. Inner and outer surfaces of the second lower electrode 40a are in contact with the capacitor insulating film 33. The second lower electrode 40a includes upper and lower portions. The lower portion of the second lower electrode 40a is in contact with the upper and inner surface of the first lower electrode 30. The upper portion of the second lower electrode 40a extends from the upper surface of the first lower electrode 30. The second electrode film 37a forming the second lower electrode 40a forms not only the lower electrode of the upper capacitor, but also a part of the lower electrode of the lower capacitor.

A stacked capacitor of the first embodiment includes upper and lower capacitors. A lower electrode of the upper capacitor includes a single-layered structure including the second lower electrode 40a. A lower electrode of the lower capacitor includes a double-layered structure including the first and second lower electrodes 30 and 40. An outer diameter of the second lower electrode 40a forming the upper capacitor is equal to or greater than an outer diameter of the first lower electrode 30 such that the upper surface of the first lower electrode 30 is inside the outer periphery of the second lower electrode 40a in plan view. An inner diameter of the second lower electrode 40a forming the upper capacitor is greater than an inner diameter of the second lower electrode 40a forming the lower capacitor by double the thickness of the first lower electrode 30.

The second electrode film 37a forms the second lower electrode 40a. The second electrode film 37a is in contact with the upper and inner surfaces of the first lower electrode 30. Accordingly, the first lower electrode 30 is in communication with the second lower electrode 40a, thereby greatly increasing a contact area between first and second lower electrodes 30 and 40.

As explained later with respect to a method of manufacturing the semiconductor device 1A, when a thickness of the first lower electrode 30 is 15 nm, and a height of the first lower electrode 30 (a thickness of a first sacrificial insulating film) is 1500 nm (1.5 µm), the second lower electrode of a related art is in contact with only the upper surface of the first lower electrode having the thickness of 15 nm. On the other hand, the second lower electrode 40a of the first embodiment is in contact with the entire inner surface of the first lower electrode 30. For this reason, the contact area between the first and second lower electrode becomes 1500/15 times, i.e., 100 times greater than that of the related art. Even if the area of the inner surface of the lower electrode decreases due to the thickness of the lower electrode, the contact area becomes at least 50 times greater.

A second supporter 29a is connected to an upper portion of an outer side surface of the second electrode film 37a forming the second lower electrode 40a. Multiple second supporters 29a extend in parallel and are arranged at a predetermined interval. The second supporters 29a form a line-and-space pattern and thus define second grooves 32. The second grooves 32 separate the second lower electrodes 40 into multiple groups. Each second supporter 29a connects upper portions of each group of the second lower electrodes 40.

The capacitor insulating film 33 includes a tantalum oxide film and has a thickness of approximately 10 nm. The capacitor insulating film 33 covers: an upper surface of the stopper insulating film 6; the outer side surface of the first lower electrode 30; an outer surface of the supporter 17a; an outer side surface, an upper surface, and an inner surface of the second lower electrode 40a; and an outer surface of the second supporter 29a. The material forming the capacitor insulating film 33 is not limited to the tantalum oxide film. Instead, a high dielectric film, such as a zirconium oxide ($ZrO_2$) film, a hafnium oxide ($HfO_2$) film, an aluminum oxide ($Al_2O_3$) film, and a silicon nitride film, or a multi-layered film including these films may be used.

The upper electrode 34 has a multi-layered structure including, for example, a titanium nitride film and a doped silicon film. The titanium nitride film covering the capacitor insulating film 33 is formed. Then, the doped silicon film covering the titanium nitride film is formed. The titanium nitride film is thin enough to cover the capacitor insulating film 33. For this reason, when the titanium nitride film is formed, spaces remain between adjacent lower electrodes and inside the lower electrode. Then, a doped-silicon film is formed so as to completely fill the spaces between the adjacent lower electrodes. Thus, the upper electrode 34 covers both inner and outer surfaces of the first and second lower electrodes 30 and 40, thereby achieving the capacitor 41 with high strength. The doped-silicon film includes a boron-doped silicon film, and the like.

A fifth inter-layer insulating film 36 is formed over the upper electrode 34. A wire 38 and a contact plug (not shown) are formed on the fifth inter-layer insulating film 36. A sixth inter-layer insulating film 39 is formed so as to cover the fifth inter-layer insulating film 36 and the wire 38. The wire 38 includes aluminum (Al), copper (Cu), and the like. The wire 38 is connected to the upper electrode 34 in a region (not shown).

The semiconductor device 1A of the first embodiment includes the capacitor 41 including crown-shaped lower electrodes that are stacked. For this reason, the capacitor 41 can achieve higher capacitance than those of the capacitors of the related art, which includes a cylindrical electrode and a crown-shaped electrode on the cylindrical electrode.

Additionally, the first lower electrode 30 is in communication with the second lower electrode 40a so as to increase the contact area between the first and second lower electrodes, thereby preventing an increase in contact resistance.

Further, the second electrode film 37a forms the second lower electrode 40a and covers the inner surface of the first lower electrode 30, thereby increasing the connection strength between the first and second lower electrodes 30 and 40. Additionally, the supporters 17a and 29a are connected to the upper portions of the outer surfaces of the first and second lower electrodes 30 and 40, respectively, so that each supporter mechanically supports multiple lower electrodes, thereby preventing the lower electrodes from collapsing and being distorted.

Hereinafter, a method of manufacturing the semiconductor device 1A according to the first embodiment of the present invention is explained with accompanying drawings.

The method of the first embodiment includes: a preparing process of forming the transistor layer 50; a process of forming the stopper insulating film 6; a process of forming a first sacrificial insulating film 16; a process of forming a first support film 17; a first process of forming the first lower electrode 30; a second process of forming the first supporter 17a and the first hole 28a; a process of forming a second sacrificial insulating film 26; a process of forming a second support film 29; a process of forming a second cylindrical hole 18b; a third process of removing a first embedded film 25; a process of forming a sidewall 42a; a process of exposing the first lower electrode 30; a fourth process of forming the second electrode 40; a fifth process of forming the second supporter 29a and the second groove 32; a sixth process of forming the first lower electrode 30 and the second lower electrode 40a; and a seventh process of forming the upper electrode 34.

The preparing process of forming the transistor layer 50 includes: a process of forming the gate electrode 43; a process of forming the first contact plug 24a and the second contact plug 24b; a process of forming the bit-line contact plug 45 and the bit wire 46; a process of forming the first capacitor contact plug 21; and a process of forming the second capacitor contact plug 23.

In the process of forming the gate electrode 43, the element isolation region 3, the element formation region 4, the first SD region 10, and the second SD region 11 are formed in the semiconductor substrate 2, adjacent to the upper surface of the semiconductor substrate 2. Then, the gate insulating film 5, the poly-crystalline silicon film 8, the metal film 9, and the gate mask nitride film 12 are formed in this order so as to cover the upper surface of the semiconductor substrate 2. Then, contact holes 44 are formed by a dry etching process so as to penetrate the gate insulating film 5, the poly-crystalline silicon film 8, the metal film 9, and the gate mask nitride film 12 and to expose the upper surfaces of the first and second SD regions 10 and 11.

Then, the gate sidewall nitride film 13 is formed so as to cover inner surfaces of the contact holes 44 and an upper surface of the gate mask nitride film 12. Thus, the gate electrode 43, which has a multi-layered structure including the poly-crystalline silicon film 8 and the metal film 9, is formed over the gate insulating film 5.

In the process of forming the first and second cell contact plugs 24a and 24b, a portion of the gate sidewall nitride film 13, which covers the bottom surface of the contact hole 44, is removed so as to expose the upper surfaces of the first and second SD regions 10 and 11. Then, a conductive film is formed so as to fill the contact hole 44. Then, an upper surface of the conductive film is polished by CMP until the upper surface of the gate sidewall nitride film 13 is exposed.

Then, a portion of the gate sidewall nitride film 13, which covers the upper surface of the gate mask nitride film 12, is removed. Then, the first inter-layer insulating film 14 is formed so as to cover the gate mask nitride film 12. Then, an upper surface of the first inter-layer insulating film 14 is polished by CMP until an upper surface of the conductive film is exposed. Thus, the first and second cell contact plugs 24a and 24b are formed.

In the process of forming the bit-line contact plug 45 and the bit wire 46, the second inter-layer insulating film 15 is formed so as to cover the upper surfaces of the first and second cell contact plugs 24a and 24b. Then, a contact hole (not shown) is formed in the second inter-layer insulating film 15 so as to expose the upper surface of the first cell contact plug 24a. Then, a tungsten (W) film filling the contact hole is formed through a barrier film, such as a TiN/Ti film. Then, an upper surface of the tungsten film is polished by CMP until an upper surface of the second inter-layer insulating film 15 is exposed. Thus, the bit-line contact plug 45 connected to the first cell contact plug 24a is formed. Then, the bit wire 46 is formed so as to cover the bit-line contact plug 45.

In the process of forming the first capacitor contact plug 21, the third inter-layer insulating film 20 is formed so as to cover the second inter-layer insulating film 15 and the bit wire 46. The third inter-layer insulating film 20 is made of silicon oxide and the like.

Then, a contact hole (not shown) penetrating the second and third inter-layer insulating films 15 and 20 are formed so as to expose an upper surface of the second cell contact plug 24b. Then, a metal film is formed so as to fill the contact hole. Then, an upper surface of the metal film is polished by CMP until an upper surface of the third inter-layer insulating film 20 is exposed. Thus, the first capacitor contact plug 21 connecting the second cell contact plug 24b is formed. The cross-sectional views illustrating the process explained so far are omitted hereinafter.

In the process of forming the second capacitor contact plug 23, the fourth inter-layer insulating film 22 is formed so as to cover the first capacitor contact plug 21 and the third inter-layer insulating film 20. The fourth inter-layer insulating film 22 is made of silicon oxide and the like. Then, a contact hole penetrating the fourth inter-layer insulating film 22 is formed so as to expose the upper surface of the first capacitor contact plug 21. Then, a metal film is formed so as to fill the contact hole. Then, an upper surface of the metal film is polished by CMP so as to expose the upper surface of the fourth inter-layer insulating film 22. Thus, the second capacitor contact plug 23 connecting to the first capacitor contact plug 21 is formed.

The first process includes: a process of forming the stopper insulating film 6; a process of forming the first sacrificial insulating film 16; a process of forming the first support film 17; and a process of forming the first lower electrode 30.

Figure 2:
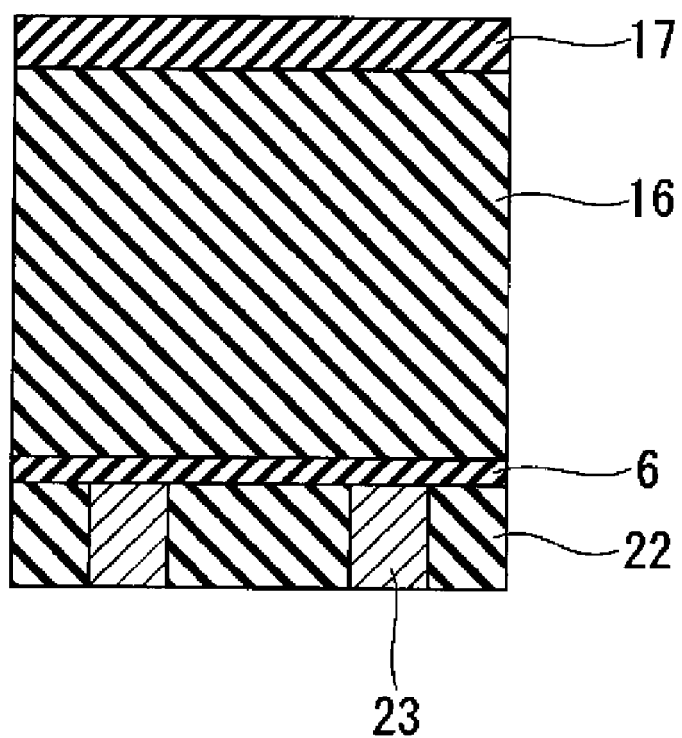

In the process of forming the stopper insulating film 6, the stopper insulating film 6 is formed so as to cover the second capacitor contact plug 23 and the fourth inter-layer insulating film 22, as shown in FIG. 2. The stopper insulating film 6 is made of a silicon nitride film having a thickness of, for example, 100 nm. The material of the stopper insulating film 6 is not limited to the silicon nitride film, and another material may be used as long as the material has selectivity with respect to the first sacrificial insulating film 16 and the second sacrificial insulating film 26 in a dry-etching process and a wet-etching process, which will be explained later.

In the process of forming the first sacrificial insulating film 16, the first sacrificial insulating film 16 is formed so as to cover the stopper insulating film 6, as shown in FIG. 2. The first sacrificial insulating film 16 is made of a silicon nitride film and has a thickness of approximately 1.5 µm. The material of the first sacrificial insulating film 16 is not limited to the silicon nitride film, and a BPSG (Boron Phosphorous Silicon Glass) film, an SOD (Spin On Dielectric) film, and the like may be used.

In the process of forming the first support film 17, the first support film 17 is formed so as to cover the first sacrificial insulating film 16, as shown in FIG. 2. The first support film 17 is made of a silicon nitride film and has a thickness of approximately 100 nm. The material of the first support film 17 is not limited to the silicon nitride film, and another material may be used as long as the material has selectivity with respect to the first sacrificial insulating film 16 and the second sacrificial insulating film 26 in the wet-etching process, which will be explained later.

In the process of forming the first lower electrode 30, the first lower electrode 30 is formed as shown in FIGS. 3 to 6. FIG. 3A is a cross-sectional view taken along line B-B' shown in FIG. 3B. FIG. 3B is a horizontal-sectional view taken along line A-A' shown in FIG. 3A. X and Y directions are defined as shown in FIG. 3B.

Figure 3A:
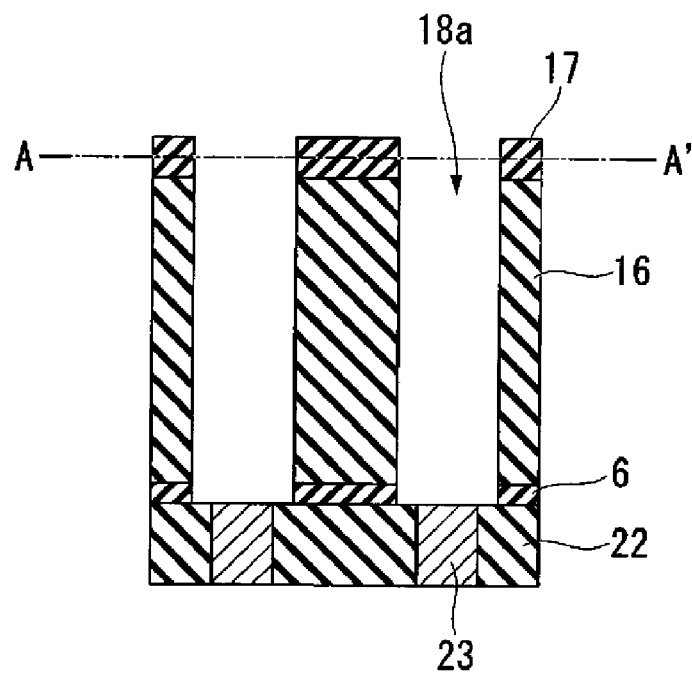
Figure 3B:
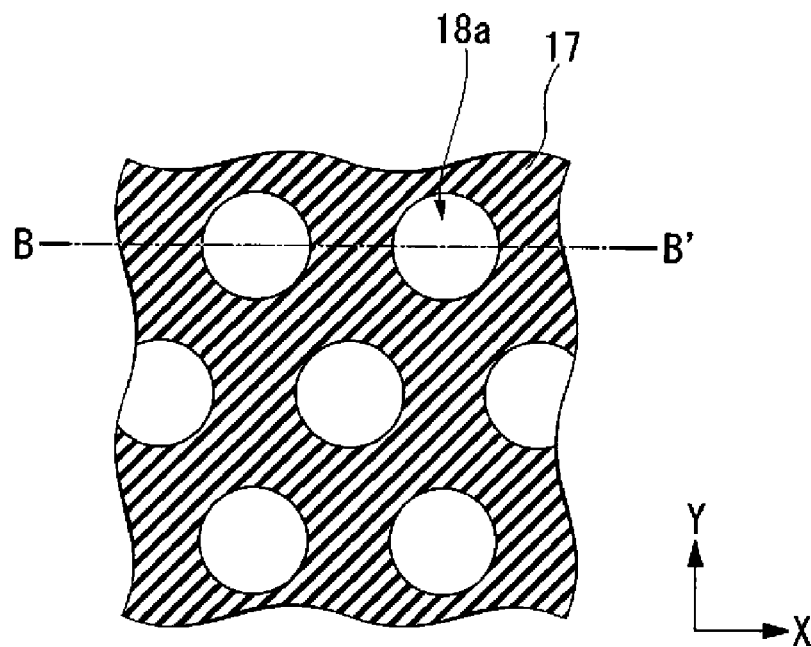

As shown in FIG. 3B, an opening pattern is formed by a lithography process using a protection insulating film (not shown), such as a photoresist film. Positions of holes of the opening pattern correspond to those of the second capacitor contact plugs 23.

Then, the first support film 17, the first sacrificial insulating film 16, and the stopper insulating film 6 are dry-etched using the protection insulating film as a mask, as shown in FIG. 3A. Thus, a first cylindrical hole 18a, through which the upper surface of the second capacitor contact plug 23 is exposed, is formed. The first cylindrical hole 18a has a diameter of, for example, 100 nm. The adjacent first cylindrical holes 18a are separated from each other by, for example, 100 nm. As shown in FIG. 3B, the first cylindrical holes 18a are arranged in the X and Y directions at a predetermined pitch.

Figure 4:
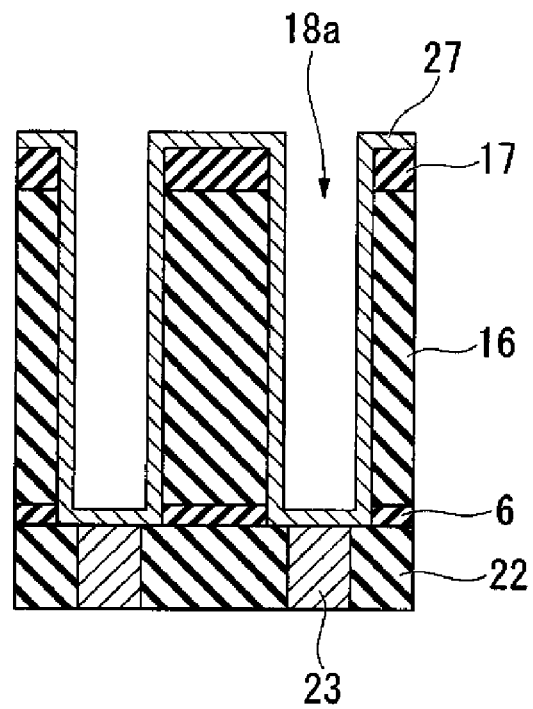

Then, the first electrode film 27 is formed by CVD so as to cover bottom and inner side surfaces of the first cylindrical hole 18a and an upper surface of the first support film 17, as shown in FIG. 4. The first electrode film 27 is made of a titanium nitride (TiN) film having a thickness of, for example, 15 nm. The material of the first electrode film 27 is not limited to the titanium nitride (TiN) film. A high melting point metal film, such as a multi-layered film including a titanium nitride film and a titanium film, a doped silicon film, and the like may be used.

Figure 5:
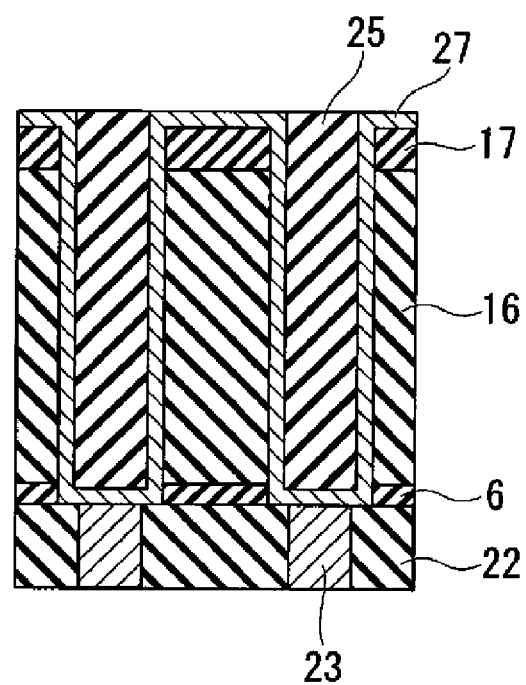
Figure 6:
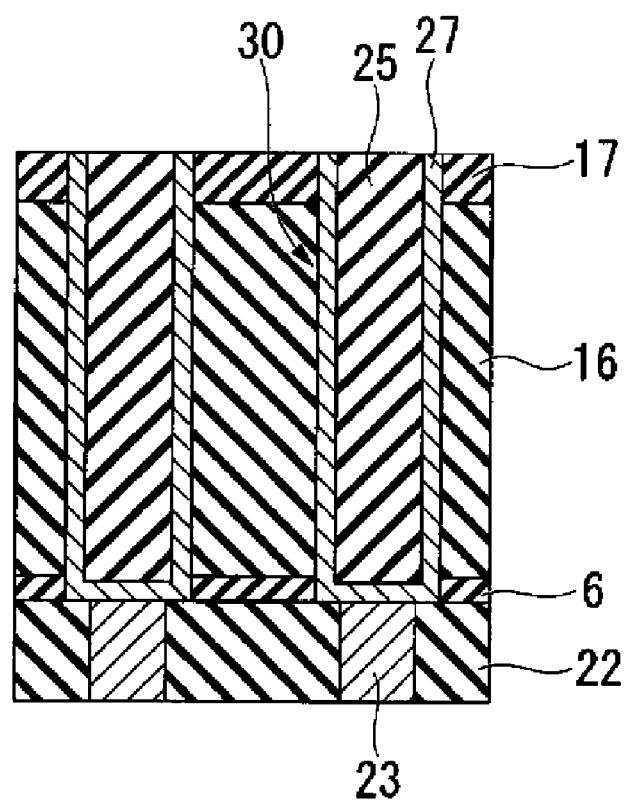

Then, a silicon oxide film is formed so as to fully fill the first cylindrical hole 18a, as shown in FIG. 5. Then, a portion of the silicon oxide film, which covers the upper surface of the first electrode film 27, is removed by CMP. Thus, the first embedded film 25 filling the first cylindrical hole 18a is formed. The material of the first embedded film 25 is not limited to the silicon oxide film. A BPSG film, an SOD film, and the like may be used. A dry etching process may be used for forming the first embedded film 25.

Then, a portion of the first electrode film 27, which covers the upper surface of the first support film 17, is removed by CMP using the first support film 17 as a stopper film, so that the upper surface of the first support film 17 is exposed. In this case, a dry etching process may be used. Thus, the first cylindrical lower electrodes 30 are formed. The first cylindrical lower electrodes 30 penetrate the first support film 17, the first sacrificial insulating film 16, and the stopper film 6, and connect to the respective second capacitor contact plugs 23. In this case, the CMP process for the silicon oxide film and the CMP process for the first electrode film 27 are sequentially carried out as one process. The first lower electrode 30 forms a part of the lower electrode of the lower capacitor.

Figure 7A:
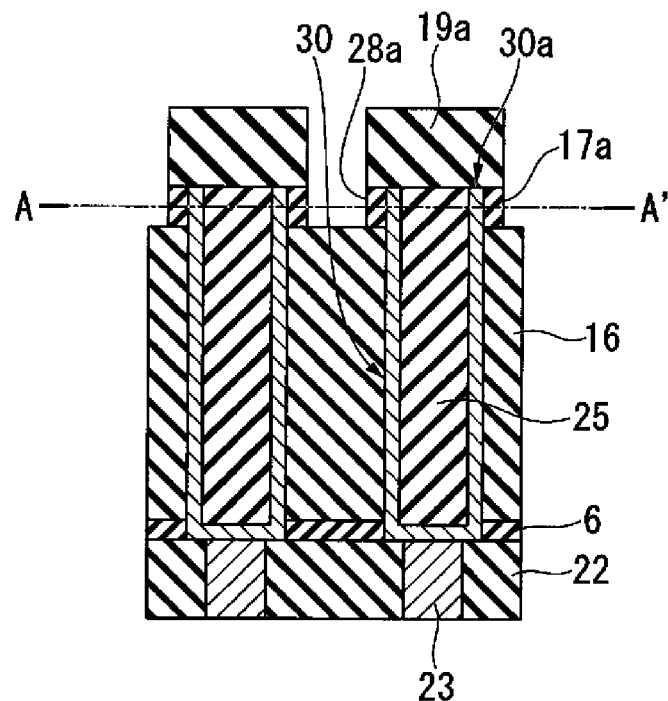
Figure 7B:
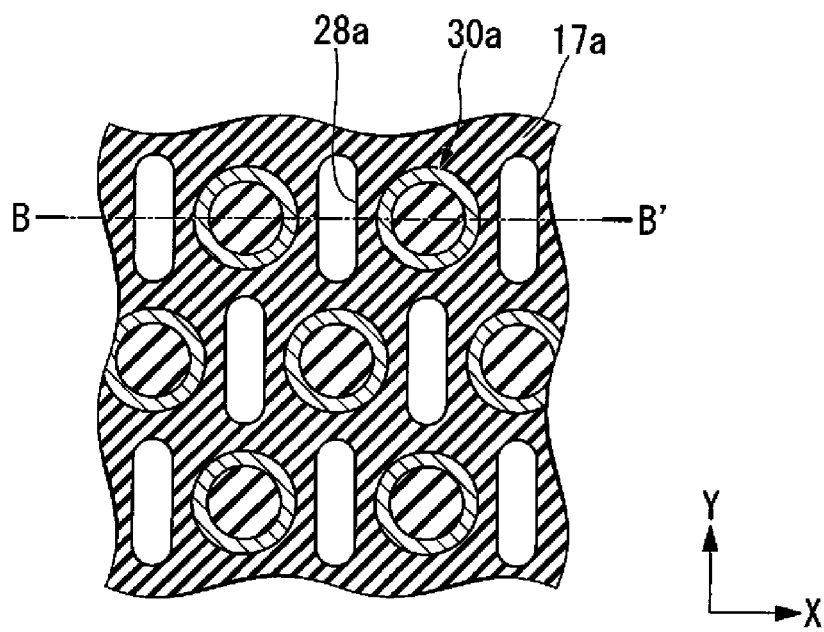

The second process includes a process of forming the first supporter 17a and the first hole 28a. FIG. 7A is a cross-sectional view taken along line B-B' shown in FIG. 7A. FIG. 7B is a horizontal-sectional view taken along line A-A' shown in FIG. 7A.

A photoresist pattern (first resist mask 19a), which has elongated holes between adjacent lower electrodes 30, is formed by a photolithography process so as to cover the first support film 17. The size of each elongated hole is, for example, 50 nm in the X direction and 50 nm to 150 nm in the Y direction. The elongated hole is positioned at the center between two adjacent lower electrodes 30 arranged in the X direction. At the same time, the elongated hole is positioned at the center between two adjacent lower electrodes 30 arranged in the Y direction. Consequently, the distance between the first lower electrode 30 and the adjacent elongated hole arranged in the X direction is 25 nm, which is one fourth of the outer diameter of the first lower electrode 30. Similarly, the first lower electrode 30 is separated from the adjacent elongated hole arranged in the Y direction by at least one fourth of the outer diameter of the first lower electrode 30. Although it is explained in the first embodiment that the hole is elongated in the Y direction, the hole may be elongated in the X direction or in an oblique direction.

Then, a dry etching is carried out using the first resist mask 19a, as shown in FIG. 7A. Consequently, portions of the first support film 17, which correspond to the elongated holes of the photoresist pattern (first resist mask 19a), are removed such that the upper surface of the first sacrificial insulating film 16 is exposed. Thus, the first hole 28a, through which the first supporter 17a and the first sacrificial insulating film 16 are partially exposed, is formed. The first hole 28a is positioned in plan view at the center of a rhomboid region formed by four lines connecting four centers of the four nearest neighbor first lower electrodes 30. The first hole 28a is separated from any of the first lower electrodes 30.

FIG. 7B is a plan view illustrating the positions of the first supporter 17a and the first holes 28. The first supporter 17a is connected to an upper portion of the outer side surface of each first lower electrode 30, and thereby connects all of the first lower electrodes 30. Thus, the first supporter 17a strongly and mechanically supports the first lower electrodes 30, thereby preventing the first lower electrodes 30 from collapsing even if the outer side surfaces of the first lower electrodes 30 are exposed in a later process. The first holes 28 are elongated in the Y direction and arranged at a predetermined pitch.

The third process includes: a process of forming the second sacrificial insulating film 26; a process of forming the second support film 29; a process of forming the second cylindrical hole 18b; and a process of removing the first embedded film 25.

Figure 8:
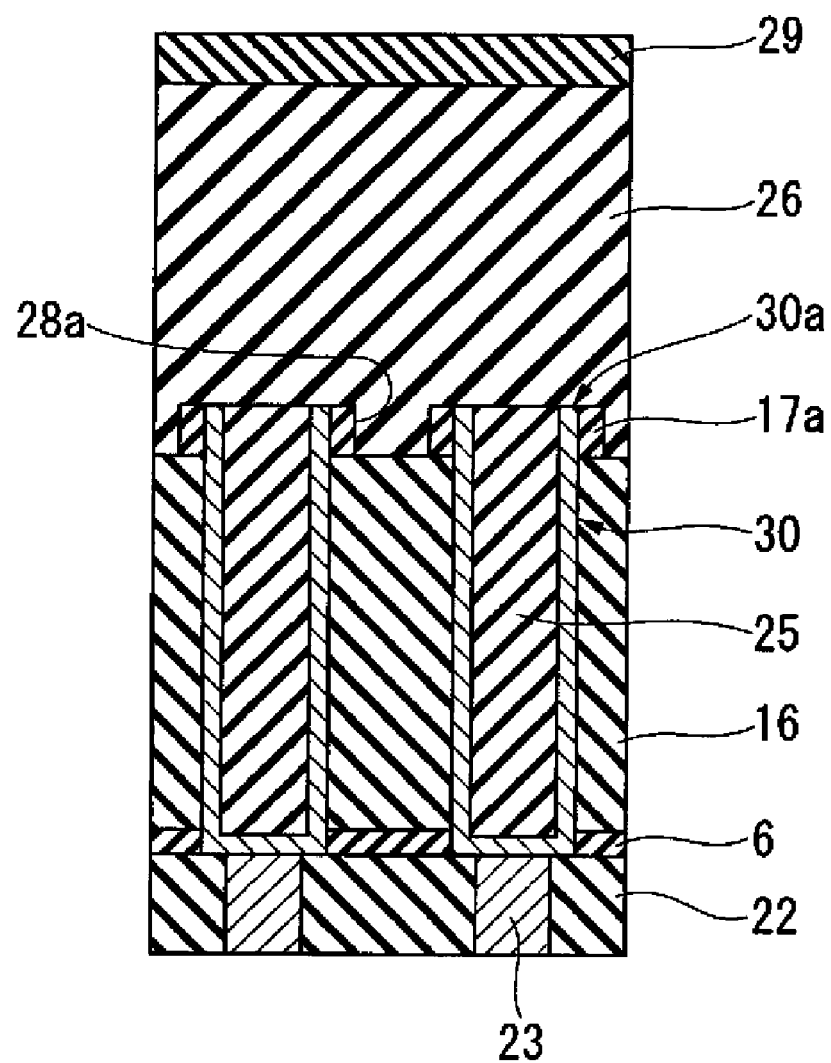

In the process of forming the second sacrificial insulating film 26, the first resist mask 19a is removed first. Then, the second sacrificial insulating film 26 is formed so as to cover the upper surface of the first lower electrode 30 (first upper surface 30a), the first supporter 17a, and the first hole 28a, as shown in FIG. 8. The second sacrificial insulating film 26 is made of a silicon oxide film and has a thickness of approximately 1.5 μm. The material of the second sacrificial insulating film 26 is not limited to the silicon oxide film. A BPSG film, an SOD film, and the like may be used.

In the process of forming the second support film 29, the second support film 29 is formed so as to cover the second sacrificial insulating film 26. The second support film 29 is made of a silicon nitride film and has a thickness of approximately 100 nm. The material of the second support film 29 is not limited to the silicon nitride film. Another material may be used as long as the material has selectivity with respect to the first sacrificial insulating film 16 and the second sacrificial insulating film 26.

Figure 9A:
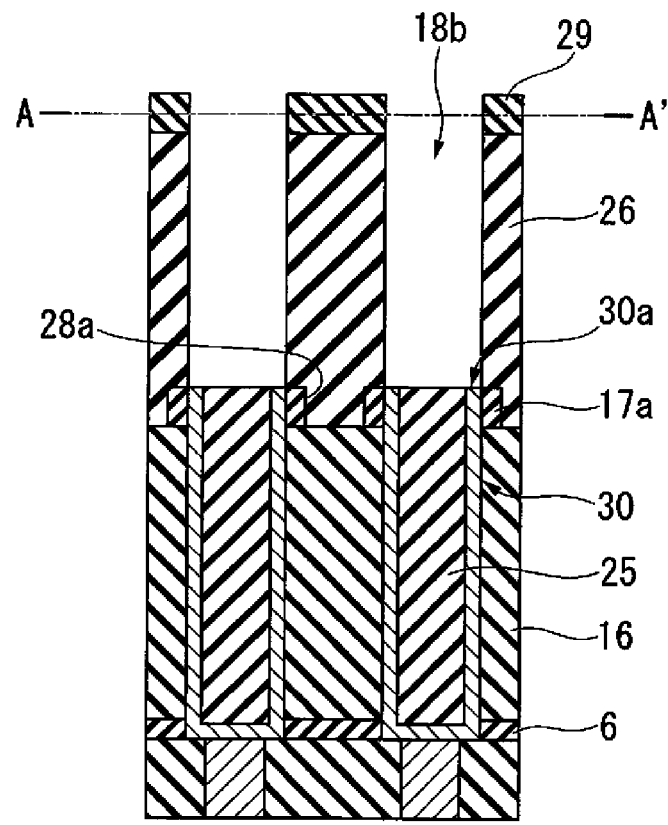
Figure 9B:
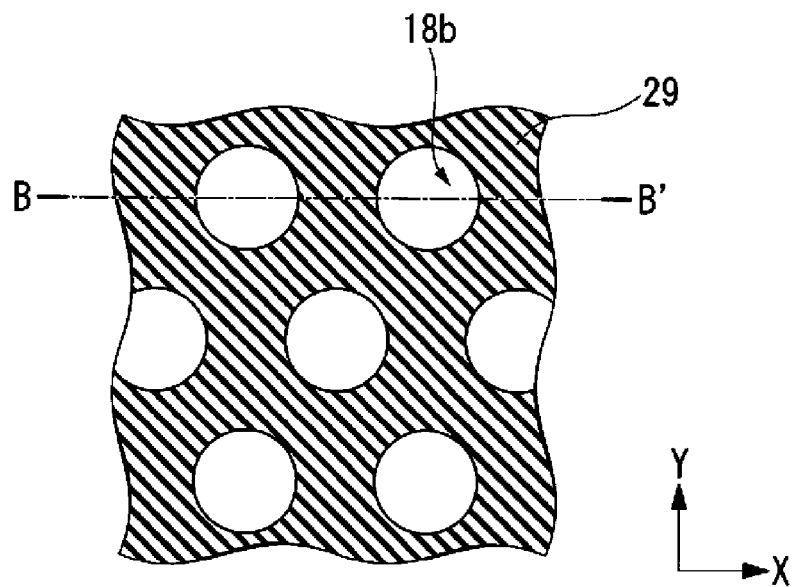

In the process of forming the second cylindrical hole 18b, the second cylindrical holes 18b are formed as shown in FIG. 9. FIG. 9A is a cross-sectional view taken along line B-B' shown in FIG. 9B. FIG. 9B is a horizontal-sectional view taken along line A-A' shown in FIG. 9A. The X and Y directions are defined as shown in FIG. 9B.

Firstly, an opening pattern, which will be a mask for forming the second cylindrical hole 18b, is formed on the second support film 29 using a protection insulating film (not shown), such as a photoresist film. The size and portion of each hole of the opening pattern is determined such that the entire upper surface of the first lower electrode 30 (first upper surface 30a) will be exposed through the hole, and that the hole of the opening pattern does not overlap the first hole 28a in plan view. Accordingly, the size of the hole of the opening pattern is equal to or greater than the outer diameter of the first lower electrode 30. In this case, the first lower electrode 30 is separated from the hole 28 by one fourth of the outer diameter of the first lower electrode 30. For this reason, the size of the hole is set to be smaller than a value obtained by adding half the value of the outer diameter of the first lower electrode 30 to the value of the outer diameter of the first lower electrode 30. Accordingly, a portion of the first sacrificial insulating film 16, which is positioned under the first hole 28a, can be prevented from being etched in a dry etching process that will be explained later.

Then, the second support film 29 and the second sacrificial insulating film 26 are dry-etched using the opening pattern as a mask, as shown in FIG. 9A. Thus, the second cylindrical holes 18b is formed, which penetrate the second sacrificial insulating film 26 and expose the upper surfaces of the first lower electrodes 30 (first upper surfaces 30a). The second cylindrical hole 18b does not overlap the first opening 28 in plan view. The diameter of the second cylindrical 18b is, for example, 100 nm. The adjacent second cylindrical holes 18b are separated from each other by, for example, 100 nm. The second cylindrical holes 18b are arranged both in the X and Y directions at a predetermined pitch.

The dry etching process is carried out with selectivity with respect to the first support film 17a and the first lower electrode 30. The first support film 17 can be used as a stopper film for forming the second cylindrical hole 18b. Consequently, the first support film 17a, which is exposed through the second cylindrical hole 18b, remains without being affected by the dry etching process. In this etching process, a recess structure may be formed in the first embedded film 25, adjacent to the upper surface of the first embedded film 25 by over-etching. After the second cylindrical hole 18b is formed, the protection insulating film used as a mask is removed.

The fourth process includes: a process of forming the sidewall 42a; a process of exposing the first lower electrode 30; and a process of forming the second lower electrode 40a.

Figure 10:
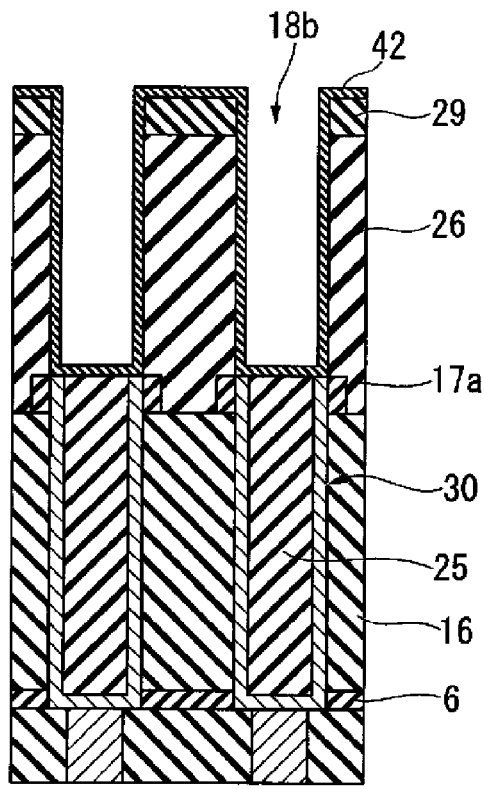

In the process of forming the sidewall 42a, a protection insulating film 42 is formed so as to cover inner and bottom surfaces of the second cylindrical hole 18b and an upper surface of the second support film 29, as shown in FIG. 10. The protection insulating film 42 is made of a silicon nitride film and has a thickness of, for example, 20 nm. The material of the protection insulating film 42 is not limited to the nitride film. Another material may be used as long as the material has selectivity with respect to the second embedded film 35.

Figure 11:
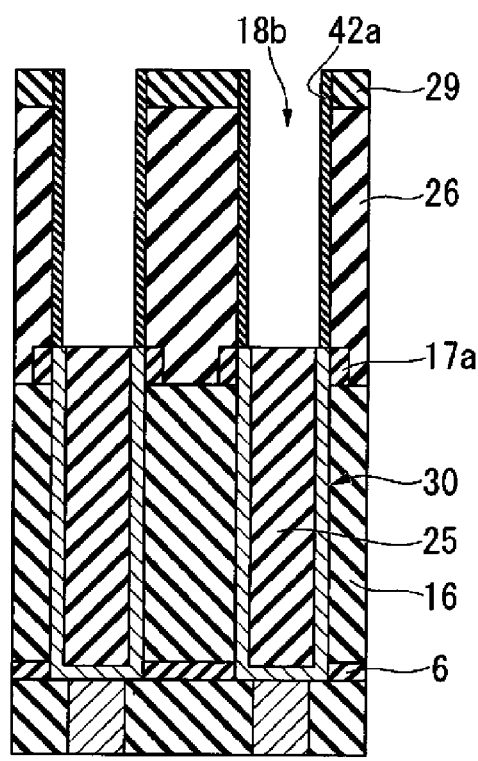
Figure 12:
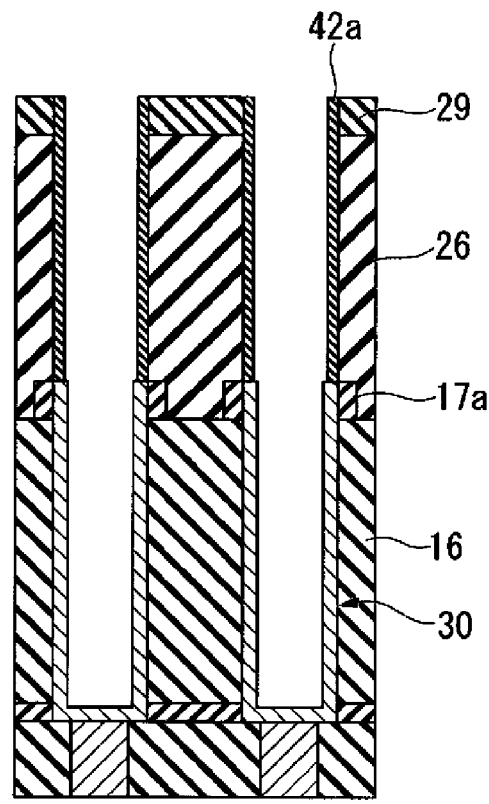

Then, a portion of the protection insulating film 42 which covers the upper surface of the second support film 29 and a portion of the protection insulating film 42 which covers the bottom surface of the second cylindrical hole 18b are dry etched. In this case, it has to be careful not to expose a side surface of the second sacrificial insulating film 26. If the protection insulating film 42 is overetched, an upper portion of the protection insulating film 42 which covers a side surface of the second support film 29 is removed. Therefore, the side surface of the second sacrificial insulating film 26 is exposed. If the first embedded film 25 is etched in a following etching process in this state, the second sacrificial insulating film 26 is etched at the same time, thereby causing a short circuit between adjacent capacitors. To solve this problem, the etching process is stopped when the etched upper surface of the protection insulating film 42 matches the upper surface of the second support film 29. Thus, the sidewall 42a, which covers the inner side surface of the second cylindrical hole 18b, is formed as shown in FIG. 11.

In the process of forming the first lower electrode 30, the first embedded film 25 is removed by a wet etching process using a solution containing hydrofluoric acid, so that an inner surface of the first lower electrode 30 is exposed. By using the solution containing hydrofluoric acid, the silicon oxide film forming the first embedded film 25 can be removed with a higher selectivity with respect to the silicon nitride film forming the second support film 29 and the sidewall 42a, and the titanium nitride film forming the first lower electrode 30. Accordingly, the second support film 29, the sidewall 42a, and the first lower electrode 30 can remain, thereby preventing the first and second sacrificial insulating films 16 and 26 from being etched.

Figure 13:
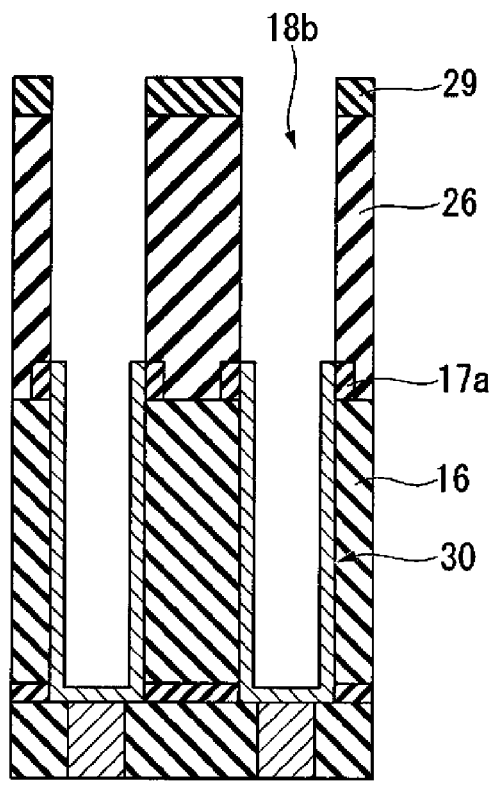

Then, the sidewall 42a, made of a silicon nitride film having a thickness of 20 nm, is removed by an etching process using a solution containing a heated phosphoric acid, so that the side surface of the second sacrificial insulating film 26 is exposed to the second cylindrical hole 18b, as shown in FIG. 13. When the sidewall 42a is made of a silicon nitride film, a heated phosphoric acid solution is used as an etchant. When the sidewall 42a is made of another material, another etchant is used.

When the sidewall 42a, made of the silicon nitride film having the thickness of 20 nm is etched, the upper portion of the second support film 29, which is also made of a silicon nitride film, is etched by 20 nm. However, the thickness of the second support film 29 is 100 nm when the second support film 29 is formed. Therefore, even if the upper portion of the second support film 29 is etched by 20 nm, the second support film 29 can remain with a sufficient thickness.

Figure 14:
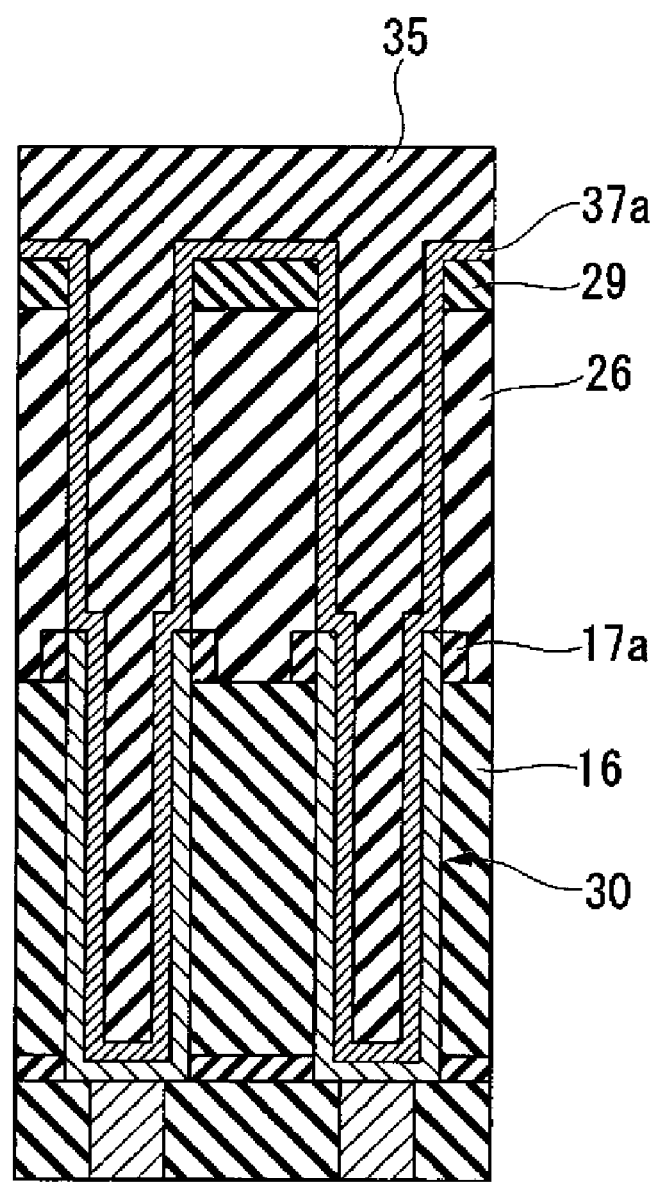

In the process of forming the second lower electrode 40a, the second electrode film 37a is formed by CVD so as to cover the inner surface of the first lower electrode 30, the upper surface of the first supporter 17a, and the inner surface of the second cylindrical hole 18b, as shown in FIG. 14. The second lower electrode 40a includes a titanium nitride film having a thickness of, for example, 15 nm. The material of the second insulating film 37 is not limited to the titanium nitride (TiN) film. A high melting point metal film, such as a multi-layered film including a titanium nitride film and a titanium film, a doped silicon film, and the like may be used. It has to be careful not to completely fill a space in the first lower electrode 30 with the second electrode film 37a, so that the upper electrode 34 can be formed in the space as will be explained later.

Then, the second embedded film 35, made of a silicon oxide film, is formed so as to fill the second cylindrical hole 18b and the space inside the first lower electrode 30 and to cover the upper surface of the second electrode film 37a. The material of the second embedded film 35 is not limited to the silicon oxide film. A BPSG film, an SOD film, and the like may be used.

Figure 15:
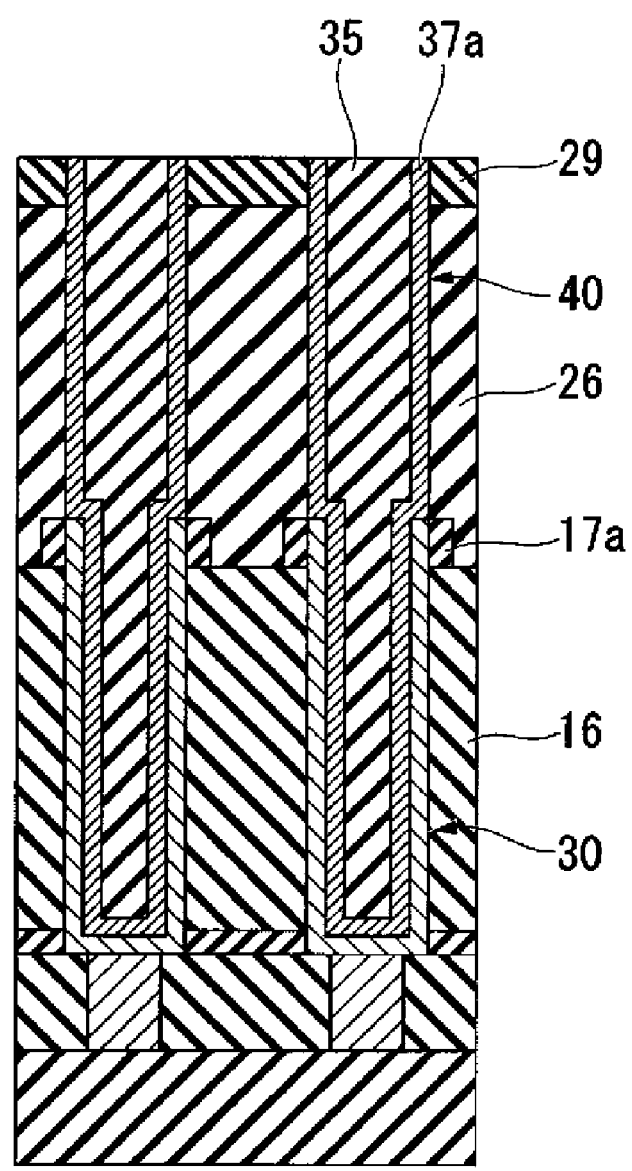

Then, a portion of a stack of the second embedded film 35 and the second electrode film 37a, which covers the upper surface of the second support film 29, is removed by CMP or dry etching so that the upper surface of the second support film 29 is exposed, as shown in FIG. 15. Thus, the second lower electrode 40a having a cylindrical shape is formed.

Figure 16A:
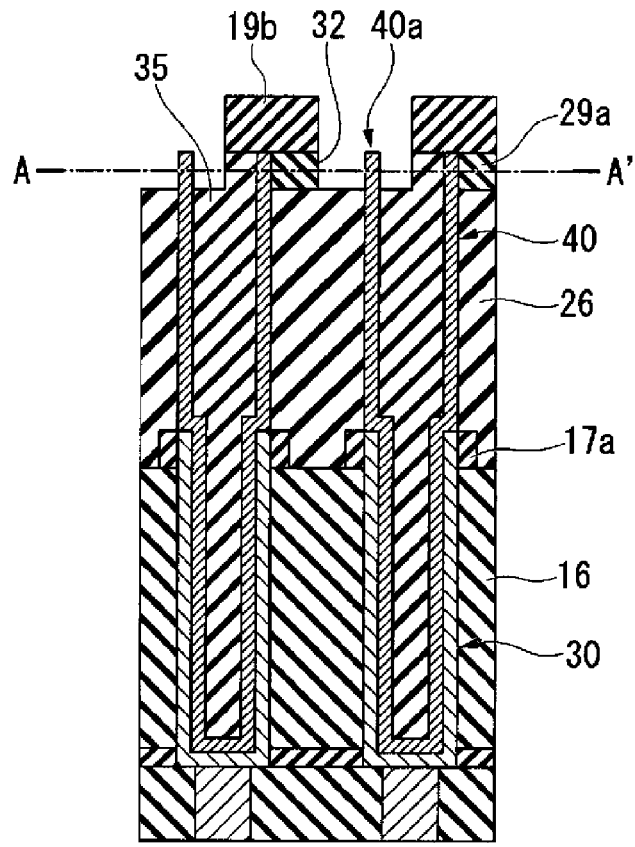
Figure 16B:
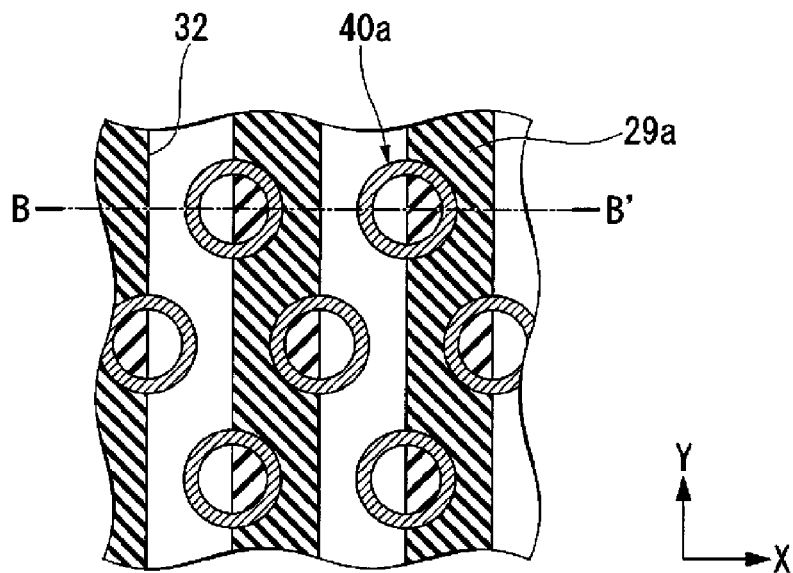

The fifth process includes a process of forming the second supporter 29a and the second hole 32. FIG. 16A is a cross-sectional view taken along line B-B' shown in FIG. 16B. FIG. 16B is a horizontal-sectional view taken along line A-A' shown in FIG. 16A.

In the process of forming the second supporter 29a and the second hole 32, a photoresist pattern (second resist mask 19b) is formed on the second support film 29 by a photolithography process. The photoresist pattern forms a line-and-space pattern. Each of the line portion and the space portion has a width of, for example, 100 nm. The line-and-space pattern extends in the Y direction. A line of the side surface of each second resist mask 19b, which is the line portion, passes the centers of the second lower electrodes 40 arranged in the Y direction. Although it has been explained that the line-and-space pattern extends in the Y direction, the line-and-space pattern extending in the X direction may be formed. Although the line portion and the space portion, which have different widths, can be formed, the widths of the line portion and the space portion are preferably the same in consideration of resolution of the lithography.

Then, a dry etching process is carried out using the second resist mask 19b. Thus, the second support film 29 is partially removed. Additionally, the second sacrificial insulating film 26 and an upper portion of the second lower electrode 40a are partially exposed. Thus, the second supporter 29a is formed. A removed portion of the second support film 29 forms a second hole 32, through which the upper surface of the second sacrificial insulating film 26 is exposed. Thus, a line-and-space structure is formed. The second supporters 29a extend in the Y direction (or in the X direction). Specifically, the second hole 32 separates adjacent line portions of the second supporters 29a from each other. Multiple line portions of the second supporters 29a connect upper portions of outer side surfaces of multiple second lower electrodes 40. For this reason, the second supporters 29a strongly and mechanically support the second lower electrodes 40, thereby preventing the second lower electrodes 40 from collapsing even if the outer side surfaces of the second lower electrodes 40 are exposed in a later process.

Figure 17A:
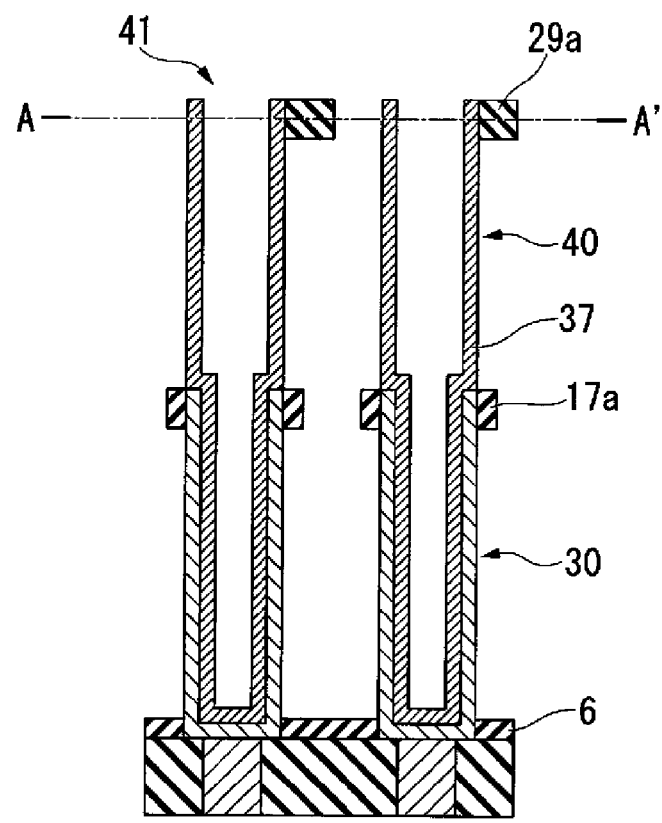
Figure 17B:
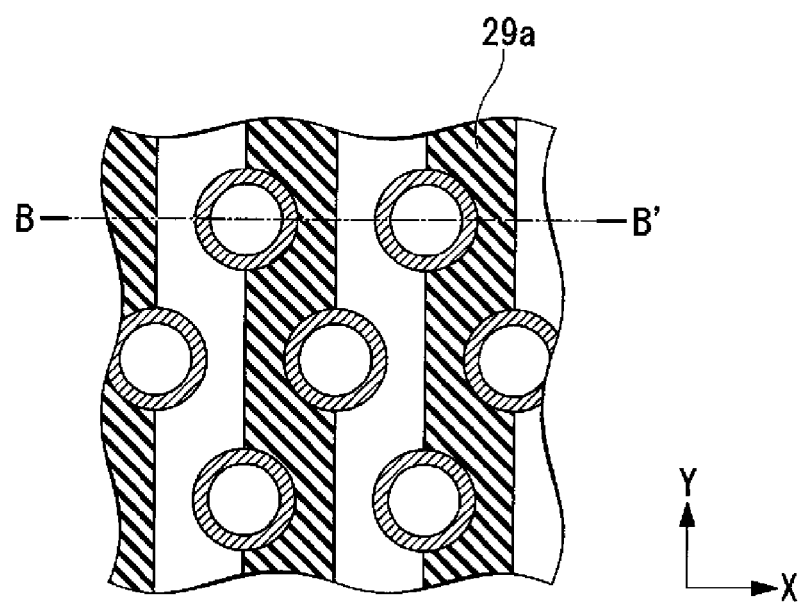
Figure 18:
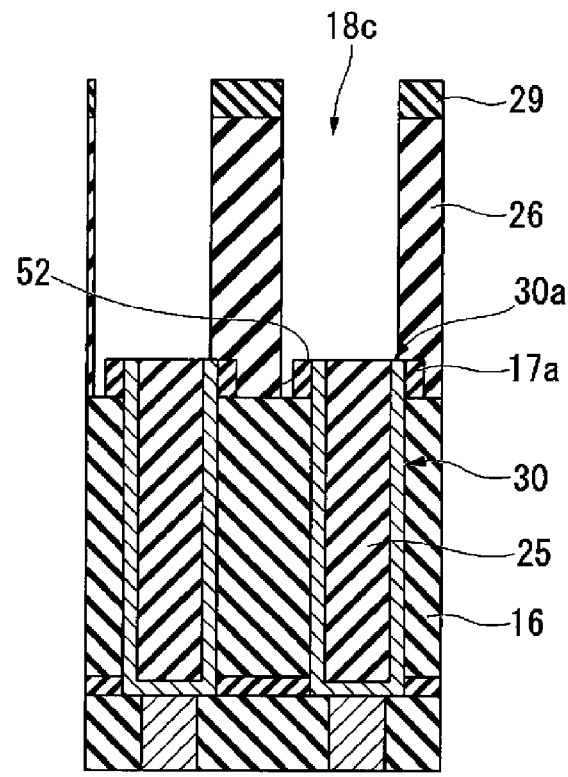
FIGS. 18 to 20 are cross-sectional views illustrating a method of manufacturing a semiconductor device according to a second embodiment of the present invention.

The sixth process includes a process of exposing the first lower electrode 30 and the second lower electrode 40a. FIG. 17A is a cross-sectional view taken along line B-B' shown in FIG. 17B. FIG. 17B is a horizontal-sectional view taken along line A-A' shown in FIG. 17A.

In the process of exposing the first lower electrode 30 and the second lower electrode 40a, the second resist mask 19b is removed. Then, a wet etching process is carried out using hydrofluoric acid. Specifically, an etchant is introduced through the second hole 32 and the first hole 28a. Consequently, the second embedded film 35, the second sacrificial insulating film 26, and the first sacrificial insulating film 16 are removed. Thus, the outer side surface of the first lower electrode 30, the inner surface of the second lower electrode 40a, upper and outer side surfaces of the upper portion of the second lower electrode 40a, the first supporter 17a, the second supporter 29a, and the stopper insulating film 6 are exposed. Instead of the wet etching process, a dry etching process may be used for removing the second embedded film 35, the second sacrificial insulating film 26, and the first sacrificial insulating film 16.

Thus, the first cylindrical lower electrode 30 having a height of 1.5 μm and a second cylindrical lower electrode 40 having a height of 1.5 μm are exposed. The lower portion of the second lower electrode 40a is connected to the inner surface of the first lower electrode 30. The second lower electrode 40a is deposited on the first lower electrode 30. Accordingly, the inner and outer surfaces of the first and second lower electrodes 30 and 40 can be used as the capacitor 41, thereby enabling an increase in a surface area of the capacitor 41, and therefore enabling an increase in the electrostatic capacitance of the capacitor 41.

The seventh process includes: a process of forming the capacitor insulating film 33; a process of forming the upper electrode 34; a process of forming the fifth inter-layer insulating film 36; a process of forming the wire 38; and a process of forming the sixth inter-layer insulating film.

In the process of forming the capacitor insulating film 33, the capacitor insulating film 33 is formed by CVD so as to cover the first and second lower electrodes 30 and 40. The capacitor insulating film 33 is made of a tantalum oxide film and has a thickness of approximately 10 nm. The material of the capacitor insulating film 33 is not limited to the tantalum oxide film. For example, a high dielectric film, such as a zirconium oxide ($ZrO_2$) film, a hafnium oxide ($HfO_2$) film, an aluminum oxide ($Al_2O_3$) film, and a silicon nitride film, or a multi-layered film including these films may be used.

In the process of forming the upper electrode 34, the upper electrode 34 is formed so as to cover the capacitor insulating film 33. The upper electrode 34 is made of, for example, a multi-layered film including a titanium nitride film and a doped silicon film. The titanium nitride film has a thickness of approximately 10 nm. A space, which remains between adjacent capacitors when the titanium nitride film is formed, is filled with the doped silicon film. Thus, the capacitor 41, including the first lower electrode 30, the second lower electrode 40a, the capacitor insulating film 33, and the upper electrode 34, can be formed. Accordingly, the upper electrode 34 mechanically supports the first and second lower electrodes 30 and 40, thereby preventing the first and second lower electrodes 30 and 40 from collapsing and being deformed.

In the process of forming the fifth inter-layer insulating film 36, the wire 38, and the sixth inter-layer insulating film 39, the fifth inter-layer insulating film 39 is formed so as to cover the upper electrode 34. Then, a contact plug (not shown) for providing an electrical potential to the upper electrode 34 of the capacitor 41 is formed. Then, the wire 38 is formed on the fifth inter-layer insulating film 36 so as to be connected to the contact plug. The wire 38 is made of, for example, a titanium nitride film and an aluminum film. Finally, the sixth inter-layer insulating film 39 is formed so as to cover the wire 38 and the fifth inter-layer insulating film 36. Thus, the semiconductor device (DRAM element) 1A of the first embodiment can be formed.

A structure of the semiconductor device 1A of the first embodiment is not limited to the above structure. The capacitor 41 may include three stacked lower electrodes (the first lower electrode 30 or the second lower electrode 40a) or more. Accordingly, the semiconductor device (DRAM element) 1A including the capacitor 41, which achieves higher electrostatic capacitance, can be formed.

According to the method of manufacturing the semiconductor device 1A of the first embodiment, the crown-shaped first lower electrode 30 and the second lower electrode 40a are sequentially deposited. Thus, the tandem capacitor 41 with a high aspect ratio can be easily formed.

Additionally, the second electrode film 37a is formed so as to cover the inner surface of the first lower electrode 30. Accordingly, the region of the inner surface of the first lower electrode 30 achieves capacitance, thereby achieving higher capacitance. Further, the second electrode film 37a forms the second lower electrode 40a and covers the inner surface of the first lower electrode 30 at the same time, thereby increasing the connection strength between the first and second lower electrodes 30 and 40, and therefore preventing the second lower electrode 40a from collapsing.

Moreover, the first and second upper portions 30a and 40a are connected to the first and second supporters 17a and 29a, respectively. Accordingly, the first and second supporters 17a and 29a can stably and mechanically support the first and second lower electrodes 30 and 40, thereby preventing the first and second lower electrodes 30 and 40 from collapsing.

Second Embodiment

Hereinafter, a semiconductor device 1B according to a second embodiment of the present invention is explained. The semiconductor device 1B of the second embodiment differs from the semiconductor device 1A of the first embodiment in that a second electrode film 37b covers a part of a side surface of the first supporter 17a, and an outer side surface of a second lower electrode 40b of the upper capacitor partially overlaps the first hole 28b in plan view. The semiconductor device 1B of the second embodiment is a modification of the semiconductor device 1A of the first embodiment. Like reference numerals denote like elements between the first and second embodiments. Hereinafter, only the second lower electrode 40b of the second embodiment, which differs from the lower electrode 40a of the first embodiment, is explained.

The cylindrical second lower electrode 40b includes the second electrode film 37b. The capacitor insulating film 33 covers the inner surface of the second lower electrode 40b and the outer surface of the upper portion of the second lower electrode 40b. The lower portion of the second lower electrode 40b is in contact with the inner surface of the first lower electrode 30. The upper portion of the second lower electrode 40b upwardly protrudes from the upper surface of the first lower electrode 30.

An outer diameter of the upper portion of the second lower electrode 40b of the upper capacitor, is greater than the outer diameter of the first lower electrode 30 such that the first lower electrode 30 is inside the upper portion of the second lower electrode 40b in plan view, and the upper portion of the second electrode 40b overlaps the first hole 28b in plan view. An inner diameter of the second lower electrode 40b forming the upper capacitor is greater than the inner diameter of the second lower electrode 40b forming the lower capacitor by twice the thickness of the first lower electrode 30 or more.

The second electrode film 37b forms the second lower electrode 40b and the lower portion of the second electrode film 37b is in contact with the upper and inner surfaces of the first lower electrode 30. The second electrode film 37b partially covers the first supporter 17a and the inner surface of the first hole 28b. Thus, the first lower electrode 30 is in communication with the second lower electrode 40b. The contact area between the first and second lower electrodes 30 and 40b is greater compared to the semiconductor device 1A of the first embodiment, thereby increasing connection strength between the first and second lower electrodes 30 and 40b, and therefore preventing the lower electrodes 30 and 40b from collapsing and being distorted.

Hereinafter, a method of manufacturing the semiconductor device 1B of the second embodiment is explained. The method of the second embodiment differs from the method of the first embodiment in that a second cylindrical hole 18c is formed such that the entire upper surface of the first lower electrode 30 (first upper portion 30a) is exposed, and that the second cylindrical hole 18c partially overlaps the first hole 28b in plan view. In other words, the second cylindrical hole 18c having a different position and size than those of the first cylindrical hole 18a of the first embodiment. The method of the second embodiment is a modification of the method of the first embodiment. Like reference numerals denote like elements between the first and second embodiments. Hereinafter, only a process of forming the second cylindrical hole 18c and a following process, which differs from the processes of the first embodiment, are explained.

In the process of forming the second cylindrical hole 18c, an opening pattern is formed over the second support film 29 using a protection insulating film, such as a photoresist film (not shown). The opening pattern will be a mask for forming the second cylindrical hole 18c. In this case, the size and position of holes of the opening pattern are determined such that the entire upper surface of the first lower electrode 30 (first upper portion 30a) is exposed, and a hole of the opening pattern partially overlaps the first hole 28b in plan view. Accordingly, an outer diameter of the hole of the opening pattern is equal to or greater than the outer diameter of the first lower electrode 30. The first lower electrode 30 is separated from the hole 28 by one fourth of the outer diameter of the first lower electrode 30. For this reason, the outer diameter of the hole of the opening pattern is equal to or greater than a value obtained by adding half of the outer diameter of the first lower electrode 30 to the outer diameter of the first lower electrode 30. Accordingly, a recess 52 will be formed in a dry etching process as explained later.

Then, the second support film 29 and the second sacrificial film 26 are dry etched using the opening pattern as a mask. In this case, a recess structure may be formed in the first sacrificial insulating film 16, adjacent to an upper surface thereof by overetching. Thus, the second cylindrical hole 18c can be formed such that the second cylindrical hole 18c penetrates the second sacrificial insulating film 26, and the first supporter 17a and the first hole 28b are partially exposed. After the second cylindrical hole 18c is formed, the protection insulating film, used as the mask, is removed.

Figure 19:
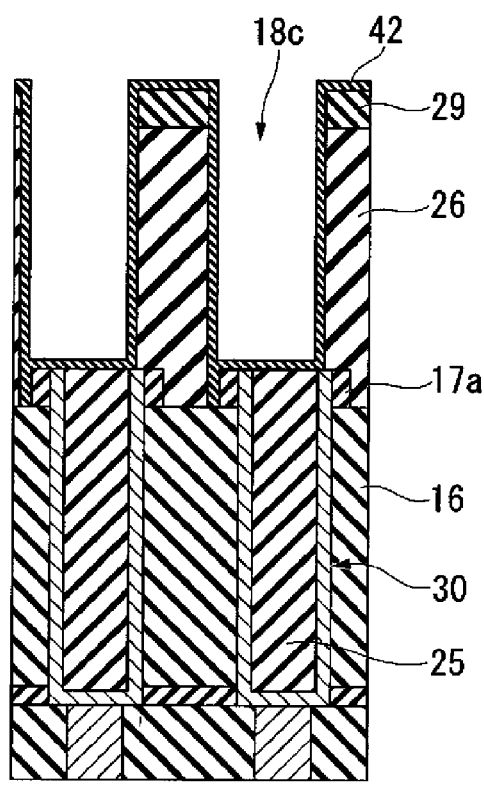

In a process of forming a sidewall 42b, the protection film 42 is formed so as to cover inner and bottom surfaces of the second cylindrical hole 18c and an upper surface of the second supporter 29 and to fill the recess 52, as shown in FIG. 19. The protection film 42 is made of a silicon nitride film having a thickness of, for example, 20 nm.

Figure 20:
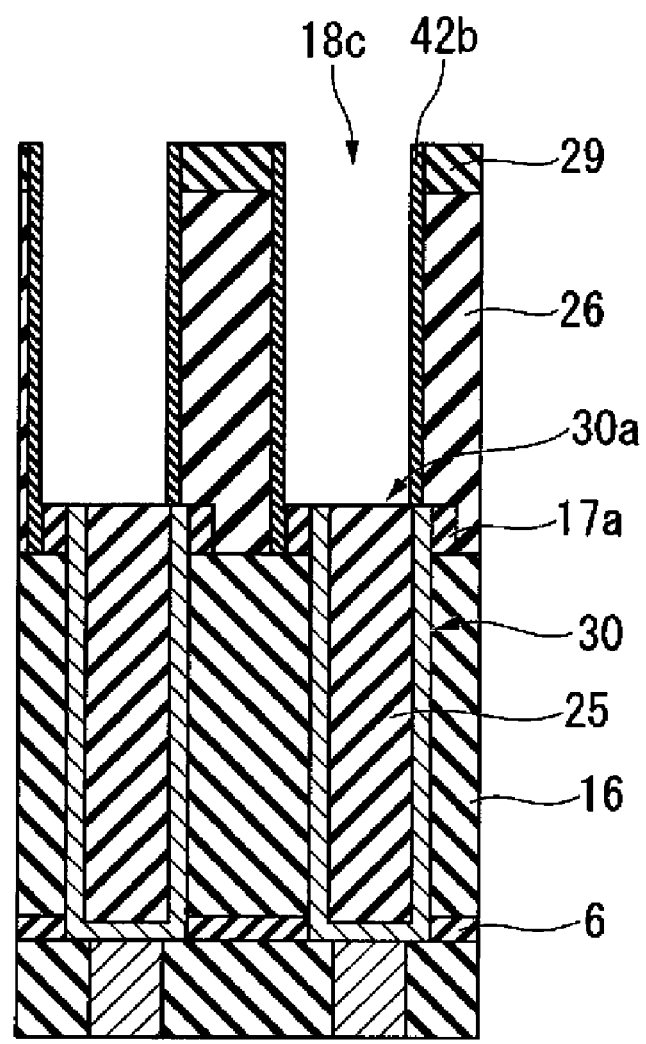

Then, portions of the protection insulating film 42, which cover the upper surface of the second support film 29 and the bottom surface of the second cylindrical hole 18c, are removed by CVD, as shown in FIG. 20. In this case, it has to be careful not to expose the side surface of the second sacrificial insulating film 26 to the second cylindrical hole 18c.

Thus, the sidewall 42b, which covers the inner side surface of the second cylindrical hole 18c and a part of the inner surface of the first hole 28b and which exposes the upper surface of the first embedded film 25, is formed. Then, a process of exposing the first lower electrode 30 and a process of forming the first lower electrode 30 are sequentially carried out. However, these processes are the same as those of the first embodiment. Therefore, an explanation thereof is omitted here.

In the process of forming the second electrode 40b, the second electrode film 37b is formed by CVD so as to cover the inner surfaces of the second cylindrical hole 18c and the first lower electrode 30, and the first supporter 17a, and to fill the recess 52. The second electrode film 37b is made of a titanium nitride (TiN) film having a thickness of 15 nm.

Then, the second embedded film 35 is formed so as to fill the second cylindrical hole 18c and a space defined by the first lower electrode 30 and to cover the second electrode film 37b. Then, portions of the second embedded film 35 and the second electrode film 37b, which are positioned over the second support film 29, are etched by CMP or dry etching. Thus, the second lower electrode 40b is formed.

Although the method of manufacturing the semiconductor device 1B of the second embodiment has been explained, a process following the process of forming the second lower electrode 40b is the same as that of the first embodiment, and therefore an explanation thereof is omitted here.

According to the method of the second embodiment, the protection insulating film 42b, which fills the recess 52, is formed. For this reason, when the first embedded film 25 is etched, a cavity is not formed by etching the first sacrificial insulating film 16. Accordingly, even if the second cylindrical hole 18c is formed so as to partially overlap the first hole 28b in plan view, a short circuit between adjacent first lower electrodes 30 and between adjacent second lower electrodes 40b can be prevented.

Third Embodiment

Hereinafter, a method of manufacturing a semiconductor device 1C according to a third embodiment of the present invention is explained. The semiconductor device 1C of the third embodiment differs from the semiconductor device 1A of the first embodiment in that a first supporter 17c and a first hole 28c horizontally extend in parallel at a predetermined pitch. The semiconductor device 1C of the third embodiment is a modification of the semiconductor device 1A of the first embodiment. Like reference numerals denote like elements between the first and third embodiments, and an explanation thereof is omitted here. Hereinafter, only the first supporter 17c, which differs from the first supporter 17a of the first embodiment, is explained.

Figure 21A:
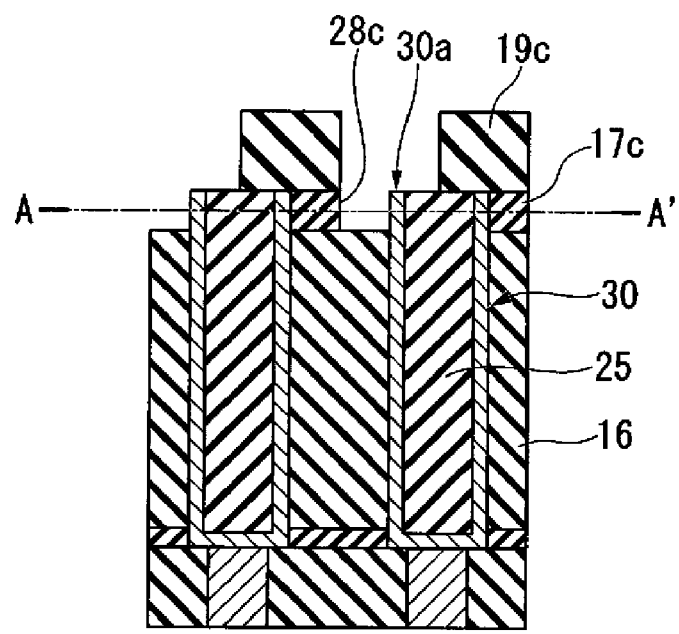
FIGS. 21 and 22 are cross-sectional views illustrating a method of manufacturing a semiconductor device according to a third embodiment of the present invention.
Figure 21B:
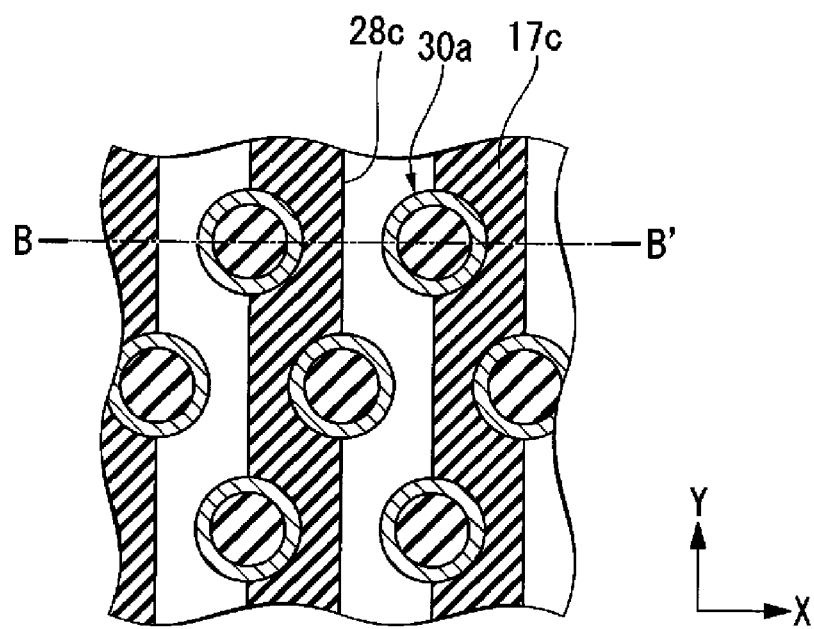

As shown in FIGS. 21A and 21B, the first supporter 17c is connected to an upper portion of the outer surface of the first electrode film 27 forming the first lower electrode 30. The first supporter 17c extends in the Y direction (or X direction). The first groove 28c is formed so as to extend in parallel to the first supporter 17c. The first supporter 17c and the first groove 28c form a line-and-space pattern. The first supporter 17c connects multiple first lower electrodes 30, which are arranged in the Y direction and overlap the first groove 28c in plan view. Accordingly, the first supporter 17c can stably and mechanically support the multiple first lower electrodes 30, thereby preventing the first lower electrodes 30 from collapsing.

Then, a method of manufacturing the semiconductor device 1C according to the third embodiment is explained.

The method of the third embodiment differs from the method of the first embodiment in that the first supporter 17c and the first groove 28c are formed so as to extend in the Y direction (or X direction). The third embodiment is a modification of the first embodiment. Like reference numerals denote like elements, and an explanation thereof is omitted here. Hereinafter, only a process of forming the first supporter 17c and the first groove 28c and a following process, which differ from the method of the first embodiment, are explained with reference to FIGS. 21A, 21B, and 22. FIG. 21A is a cross-sectional view taken along line B-B' shown in FIG. 21A. FIG. 21B is a horizontal-sectional view taken along line A-A' shown in FIG. 21A.

In the process of forming the first supporter 17c and the first groove 28c, a photoresist pattern (first resist mask 19c) is formed over the first support film 17 by a photolithography process, as shown in FIG. 21A. The photoresist pattern is a line-and-space pattern. Each of a line portion 19c and a space portion of the photoresist pattern has the same width of 100 nm. The line-and-space pattern extends in the Y direction. Lines of the side surfaces of the line portion 19c pass the centers of the first lower electrodes 30 in plan view, as shown in FIG. 21B. The line-and-space pattern may extend in the X direction instead of the Y direction. Although the line portion and the space portion may have different widths, these portions preferably have the same width in consideration of resolution of the lithography.

Then, a dry etching process is carried out using the first resist mask 19c. Consequently, the first support film 17 is partially removed, and upper portions of the first sacrificial insulating film 16 and the first lower electrode 30 are partially exposed. Thus, the first supporter 17c is formed. The removed portion of the first support film 17 forms the first groove 28c through which the upper portion of the first sacrificial insulating film 16 is exposed.

The first supporter 17c extends in the Y direction (or X direction). The first supporter 17c is connected to an upper portion of the outer side surface of the first lower electrode 30 and thus connects the upper portions of a plurality of the first lower electrodes 30. Accordingly, the first supporter 17c can stably and mechanically support the lower electrodes 30, thereby preventing the first lower electrodes 30 from collapsing even when the outer surfaces of the lower electrodes 30 are exposed in a later process.

Then, a process of forming the second sacrificial insulating film 26 and a process of forming the second support film 29 are sequentially carried out. However, these processes are the same as those of the first embodiment. Therefore, an explanation thereof is omitted here.

Figure 22:
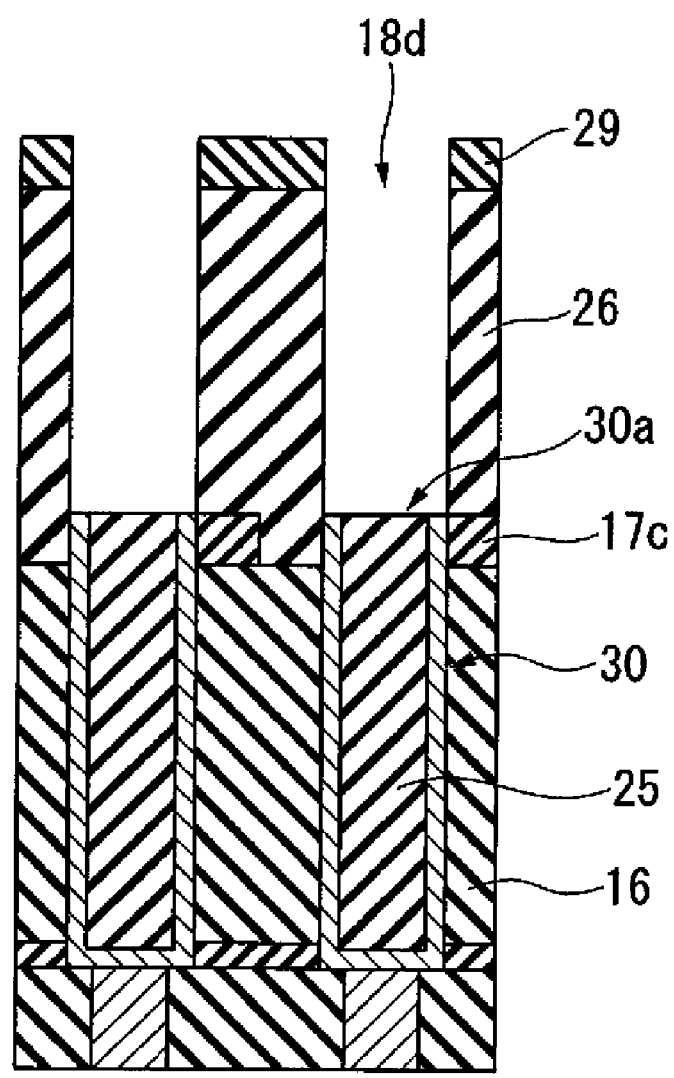

In the process of forming the second cylindrical hole 18d, an opening pattern is formed over the second support film 29 using a protection insulating film, such as a photoresist film (not shown). The opening pattern is used as a mask for forming the second cylindrical hole 18d, as shown in FIG. 22. In this case, the position and the size of a hole of the opening pattern is determined such that the upper surface of the lower electrode 30 (first upper portion 30a) will be exposed in a dry etching process as explained later, and such that the hole of the opening pattern does not overlap the first groove 28c in plan view. Accordingly, the first sacrificial insulating film 16 under the first groove 28c can be prevented from being etched in the dry etching process.

Although the method of the third embodiment has been explained, a process of forming a sidewall 42c and a later process are the same as those of the first embodiment. Therefore, an explanation thereof is omitted here.

According to the method of the third embodiment, the photoresist pattern (first resist mask 19c) is formed as a line-and-space pattern. Accordingly, a width of the groove can be increased compared to the width of the hole of the first embodiment, thereby making it easier to carry out the photolithography process, and thereby enabling the manufacturing processes to be carried out more efficiently.

Additionally, the formation of the first resist mask 19c makes it easy to provide an etchant in the first groove 28c at the time of the wet etching process. For this reason, an etching time required for removing the first sacrificial insulating film 16 in the process of exposing the first and second lower electrodes 30 and 40 can be reduced, thereby preventing defects of the capacitor 41.

The present invention is applicable to semiconductor device manufacturing industries.

As used herein, the following directional terms "forward," "rearward," "above," "downward," "vertical," "horizontal," "below," and "transverse," as well as any other similar directional terms refer to those directions of an apparatus equipped with the present invention. Accordingly, these terms, as utilized to describe the present invention should be interpreted relative to an apparatus equipped with the present invention.

The terms of degree such as "substantially," "about," and "approximately" as used herein mean a reasonable amount of deviation of the modified term such that the end result is not significantly changed. For example, these terms can be construed as including a deviation of at least ±5 percent of the modified term if this deviation would not negate the meaning of the word it modifies.

It is apparent that the present invention is not limited to the above embodiments, but may be modified and changed without departing from the scope and spirit of the invention.

For example, in one embodiment, a method of manufacturing a semiconductor device may include, but is not limited to the following processes. A first insulating film is formed over a semiconductor substrate. A first support film is formed over the first insulating film. First and second holes penetrating the first support film and the first insulating film, respectively, are formed. First and second lower electrodes covering first and second inner surfaces of the first and second holes, respectively, are formed. A second insulating film is formed over the first support film. A second support film is formed over the second insulating film. Third and fourth holes penetrating the second support film and the second insulating film, respectively, are formed so that first and second upper surfaces of the first and second lower electrodes are exposed to third and fourth holes, respectively. Third and fourth inner surfaces of the first and second lower electrodes are exposed. Third and fourth lower electrodes covering the third and fourth inner surfaces of the first and second lower electrodes, respectively, are formed. The third and fourth lower electrodes cover fifth and sixth inner surfaces of the third and fourth holes, respectively. The first and second insulating films are removed.

Regarding the above method, forming the first and second lower electrodes may include the following processes. A first electrode film covering a third upper surface of the first support film and the first and second inner surfaces of the first and second holes is formed. A first embedded film is formed over the first electrode film. A first portion of a first stack of the first electrode film and the first embedded film is removed. The first portion covers the third upper surface of the first support film.

The above method may further include the following process. After the first and second lower electrodes are formed, before the second insulating film is formed, a fifth hole penetrating the first support film is formed. The fifth hole is positioned between the first and second lower electrodes. The fifth hole is separated from the first and second lower electrodes in plan view.

The above method may further include the following process. After the first and second lower electrodes are formed, before the second insulating film is formed, a first groove penetrating the first support film is formed. The first groove partially overlaps the first and second lower electrodes in plan view.

Regarding the above method, the third and fourth holes are formed such that the third and fourth holes are separated from the fifth hole in plan view.

Regarding the above method, the third and fourth holes are formed such that at least one of the third and fourth holes overlaps the fifth hole in plan view.

Regarding the above method, exposing the third and fourth inner surfaces of the first and second lower electrodes may include the following processes. First and second sidewalls covering the fifth and sixth inner surfaces of the third and fourth holes are formed. The first embedded film is selectively removed using the first and second sidewalls as masks.

Regarding the above method, forming the third and fourth lower electrodes may include the following processes. The first and second sidewalls are removed. A second electrode film is formed, which covers the third and fourth inner surfaces of the first and second lower electrodes, the fifth and sixth inner surfaces of the third and fourth holes, and a fourth upper surface of the second support film. A second embedded film is formed over the second electrode film. A second portion of a second stack of the second electrode film and the second embedded film is removed. The second portion covers the fourth upper surface of the second support film.

The above method may further include the following process. After the third and fourth lower electrodes are formed, before the first and second insulating films are removed, a second groove penetrating the second support film is formed. The second groove partially overlaps the third and fourth lower electrodes in plan view.

The above method may further include the following process. After the first and second insulating films are removed, a capacitor electrode film is formed, which covers at least outer side surfaces of the first and second lower electrodes, top and inner side surfaces of the third and fourth lower electrodes, outer side surfaces of third and fourth portions of the third and fourth lower electrodes, the third and fourth portions covering the fifth and sixth surfaces of the third and fourth holes, respectively.

The above method may further include the following process. After the capacitor electrode film is formed, an upper electrode covering the capacitor electrode film is formed.

The invention claimed is:

1. A semiconductor device comprising:
    a first supporter layer including a plurality of first line portions each extending in a first direction, the first line portions being arranged in line in a second direction to form a plurality of first gaps each between associated adjacent first line portions, the first direction being substantially perpendicular to the second direction;
    a second supporter layer formed over the first supporter layer, the second supporter layer including a plurality of second line portions each extending in the first direction, the second line portions being arranged in line in the second direction to form a plurality of second gaps each between associated adjacent second line portions; and
    a plurality of sets of capacitor electrodes, each of the sets of capacitor electrodes passing through a corresponding one of the first gaps and reaching a corresponding one of the second gaps,
    wherein each of the sets of capacitor electrodes includes a first group of electrodes and a second group of electrodes, the first and second groups of electrodes being disposed in the second direction,
    the electrodes belonging to the first group are arranged in line in the first direction and include respective outer side-surface portions that are partially in contact with one of the associated adjacent first line portions of the first supporter layer and with one of the associated adjacent second line portions of the second supporter layer, and
    the electrodes belonging to the second group are arranged in line in the first direction and include respective outer side-surface portions that are partially in contact with the other of the associated adjacent first line portions of the first supporter layer and with the other of the associated adjacent second line portions of the second supporter layer.

2. The device as claimed in claim 1, wherein each of the electrodes belonging to each of the first and second groups is formed in cup shape and further includes an inner side-surface portion,
    and the device further comprises a dielectric film formed on the inner and outer side-surface portions of each of the electrodes belonging to each of the first and second groups, and a plate electrode formed on the dielectric film.

3. The device as claimed in claim 1, wherein the electrodes belonging to the first group and the electrodes belonging to the second group are disposed in a zigzag manner.

4. The device as claimed in claim 1, wherein each of the second gaps is substantially vertically aligned with an associated one of the first gaps.

5. The device as claimed in claim 2, wherein the dielectric film is elongated to intervene between each of the first and second supporter layers and the plate electrode.

6. A semiconductor device comprising:
    a first support layer formed over a semiconductor substrate, the first support layer including a plurality of first grooves and a plurality of pairs of first edges, each of the pairs of first edges defining an associated one of the first grooves;
    a second support layer formed over the first support layer so that the first support layer is between the semiconductor substrate and the second support layer, the second support layer including a plurality of second grooves and a plurality of pairs of second edges, each of the pairs of second edges defining an associated one of the second grooves; and
    a plurality of lower capacitor electrodes divided into a plurality of sets each including plural lower capacitor electrodes, each of the sets of lower capacitor electrodes upwardly extending with respect to the semiconductor substrate to pass through an associated one of the first grooves and reach an associated one of the second grooves,
    wherein each of the sets of lower capacitor electrodes is divided into first and second groups each including plural lower capacitor electrodes,
    each of the lower capacitor electrodes belonging to the first group is in contact with one of the pair of first edges defining an associated one of the first grooves and with one of the pair of second edges defining an associated one of second grooves, and
    each of the lower capacitor electrodes belonging to the second group is in contact with the other of the pair of first edges defining the associated one of the first grooves and with the other of the pair of second edges defining the associated one of second grooves.

7. The device as claimed in claim 6, wherein each of the first grooves is substantially vertically aligned with an associated one of the second grooves.

8. The device as claimed in claim 6, further comprising a dielectric film formed on each of the lower capacitor electrodes and an upper capacitor electrode formed on the dielectric film.

9. The device as claimed in claim 6, wherein each of the lower capacitor electrodes is formed in a cup shape including an outer side-surface and an inner side-surface,
   each of the lower capacitor electrodes belonging to the first group is at a part of the outer side-surface thereof in contact with the one of the pair of first edges defining the associated one of the first grooves and with the one of the pair of second edges defining the associated one of the second grooves, and
   each of the lower capacitor electrodes belonging to the second group is at a part of the outer side-surface thereof in contact with the other of the pair of first edges defining the associated one of the first grooves and with the other of the pair of second edges defining the associated one of second grooves.

10. The device as claimed in claim 9, further comprising a dielectric film and an upper capacitor electrode formed on the dielectric film, the dielectric film being formed on remaining parts of the outer and inner surfaces of each of the lower capacitor electrodes.

11. The device as claimed in claim 10, wherein the dielectric film is formed further on the first and second support layers to intervene between each of the first and second support layers and the upper capacitor electrode.

12. The device as claimed in claim 11, wherein each of the first grooves is substantially vertically aligned with an associated one of the second grooves.

13. The device as claimed in claim 12, wherein each of the lower capacitor electrodes includes a first portion between an associated one of the first grooves and the semiconductor substrate and a second portion between the associated one of the first grooves and an associated one of the second grooves, the first portion being greater in thickness than the second portion.

14. A semiconductor device comprising:
   a transistor layer including a plurality of transistors; and
   a capacitor layer formed over the transistor layer, the capacitor layer comprising:
   a first supporter including a plurality of first holes;
   a second supporter including a plurality of second holes, the first supporter being between the transistor layer and the second supporter so that each of the first holes is substantially aligned with an associated one of the second holes;
   a plurality of columns of lower electrodes, each including an upper portion and an intermediate portion between the upper portion and the transistor layer, adjacent two of columns of lower capacitors passing through an associated one of the first holes of the first supporter and reaching an associated one of the second holes of the second supporter and being in contact with the first and second supporters at parts of the intermediate and upper portions thereof, respectively;
   a dielectric film covering each of the lower electrodes; and
   an upper electrode formed on the dielectric film.

15. The device as claimed in claim 14, wherein the dielectric further covers each of the first and second supporters to intervene each of the first and second supporters and the upper electrode.

16. The device as claimed in claim 14, wherein each of lower electrodes is formed in cylinder shape to include outer and inner side-surfaces, and the dielectric film covers each of the outer and inner surfaces of each of the lower electrodes.

* * * * *